United States Patent [19]

Nathan et al.

[11] Patent Number: 5,917,229
[45] Date of Patent: *Jun. 29, 1999

[54] PROGRAMMABLE/REPROGRAMMABLE PRINTED CIRCUIT BOARD USING FUSE AND/OR ANTIFUSE AS INTERCONNECT

[75] Inventors: Richard J. Nathan, Morgan Hill; James J. D. Lan, Fremont; Steve S. Chiang, Saratoga, all of Calif.

[73] Assignee: Prolinx Labs Corporation, San Jose, Calif.

[ * ] Notice: This patent is subject to a terminal disclaimer.

[21] Appl. No.: 08/688,241

[22] Filed: Jul. 29, 1996

Related U.S. Application Data

[63] Continuation of application No. 08/194,110, Feb. 8, 1994, abandoned.

[51] Int. Cl.⁶ .................................................. H01L 29/00
[52] U.S. Cl. ........................ 257/529; 257/530; 257/741; 257/753; 257/759; 257/762; 257/774
[58] Field of Search ................................. 257/529, 530, 257/741, 753, 762, 759, 774

[56] References Cited

U.S. PATENT DOCUMENTS

| | | | |
|---|---|---|---|
| 3,335,327 | 8/1967 | Damon et al. . | |
| 3,384,879 | 5/1968 | Stahl et al. . | |
| 3,615,913 | 10/1971 | Shaw | 148/33.3 |
| 3,808,576 | 4/1974 | Castonguay et al. . | |
| 3,857,683 | 12/1974 | Castonguay . | |
| 3,923,359 | 12/1975 | Newsam . | |
| 4,090,667 | 5/1978 | Crimmins . | |
| 4,146,863 | 3/1979 | Mollenhoff | 337/296 |

(List continued on next page.)

FOREIGN PATENT DOCUMENTS

| | | | |
|---|---|---|---|
| 0336359 | 10/1989 | European Pat. Off. . | |
| 0510900 | 10/1992 | European Pat. Off. | 257/529 |
| 59-13368 | 7/1984 | Japan | 257/529 |
| 63-308361 | 12/1988 | Japan | 257/529 |

OTHER PUBLICATIONS

G. H. Chapman et al., "A Laser Linking Process for Restructurable VLSI", CLEO '82 (Apr. 1982) 4 pages.

P. W. Wyatt et al., "Process Considerations in Restructurable VLSI for Wafer–Scale Integration", IEDM 84 (Dec. 1984) pp. 626–629.

Philips Letter to Hugo Goris, from J. Rapaille, Jul. 6, 1994, 2 pages.

Official Gazette, "I/O Buffering System To A Programmable Switching Apparatus", Wen–Jai Hsieh, Jan. 25, 1994.

Robert Marrs, etc., "An Enhanced Performance Low Cost BGA Package", Amkor Electronics, Inc., pp. 214–225.

(List continued on next page.)

*Primary Examiner*—J. Carroll
*Attorney, Agent, or Firm*—Alan H. MacPherson; Omkar K. Suryadevara; Skjerven, Morrill, MacPherson, Franklin & Friel LLP

[57] ABSTRACT

Two types of programmable elements, fuses and antifuses, are disclosed for interconnecting the terminals of electronic components mounted on printed circuit boards (PCBs), multichip modules (MCMs) or in integrated circuit packages (IC packages). Both types of programmable elements can be fabricated as part of the regular processes used to fabricate PCBs, MCMs, or IC package (pin grid array). For fuses and antifuses, the material, geometry and dimensions can be varied to minimize the real estate and maximize programming efficiency (reduce programming time). Each type of programmable element, fuse or antifuse, can be separately used in matrices to form programmable board and package substrates. When both types of programmable elements are used together, more efficient placement and route architectures take advantage of the characteristics of each type of programmable element. Furthermore, combinations of both fuses and antifuses in the same structure allows the architecture to be reprogrammable. Fuse and antifuses can be easily used to form programmable burn-in boards and field programmable smart cards, credit cards, sockets and cable connectors.

32 Claims, 17 Drawing Sheets

U.S. PATENT DOCUMENTS

| | | | |
|---|---|---|---|
| 4,238,839 | 12/1980 | Redfern et al. | 365/96 |
| 4,245,273 | 1/1981 | Feinberg et al. . | |
| 4,247,981 | 2/1981 | Walters | 29/845 |
| 4,386,051 | 5/1983 | Edgington | 420/589 |
| 4,399,372 | 8/1983 | Tanimoto et al. | 307/279 |
| 4,413,272 | 11/1983 | Mochizuki et al. | 257/529 |
| 4,420,820 | 12/1983 | Preedy | 365/105 |
| 4,424,578 | 1/1984 | Miyamoto | 257/530 |
| 4,433,331 | 2/1984 | Kollaritsch | 340/825.83 |
| 4,455,495 | 6/1984 | Masuhara et al. | 307/44 |
| 4,458,297 | 7/1984 | Stopper et al. . | |
| 4,488,262 | 12/1984 | Basire et al. | 257/530 |
| 4,491,860 | 1/1985 | Lim | 357/68 |
| 4,507,756 | 3/1985 | McElroy | 365/104 |
| 4,507,757 | 3/1985 | McElroy | 365/104 |
| 4,547,830 | 10/1985 | Yamauchi | 257/529 |
| 4,562,639 | 1/1986 | McElroy | 29/584 |
| 4,565,712 | 1/1986 | Noguchi et al. | 427/53.1 |
| 4,566,786 | 1/1986 | Bauer et al. | 29/852 |
| 4,569,120 | 2/1986 | Stacy et al. | 29/574 |
| 4,569,121 | 2/1986 | Lim et al. | 29/574 |
| 4,585,490 | 4/1986 | Raffel et al. | 148/1.5 |
| 4,590,589 | 5/1986 | Gerzberg . | |
| 4,609,241 | 9/1986 | Peterson | 339/17 |
| 4,642,160 | 2/1987 | Burgess | 156/630 |
| 4,651,409 | 3/1987 | Ellsworth et al. | 29/576 |
| 4,652,974 | 3/1987 | Ryan | 361/395 |
| 4,678,889 | 7/1987 | Yamanaka | 219/121 |
| 4,689,441 | 8/1987 | Dick et al. | 174/68.5 |
| 4,700,116 | 10/1987 | Inoue et al. | 318/254 |
| 4,700,214 | 10/1987 | Johnson | 257/529 |
| 4,710,592 | 12/1987 | Kimbara | 174/68.5 |
| 4,721,868 | 1/1988 | Cornell et al. | 307/465 |
| 4,726,991 | 2/1988 | Hyatt et al. . | |
| 4,731,704 | 3/1988 | Lochner | 361/400.5 |
| 4,748,490 | 5/1988 | Hollingsworth | 357/51 |
| 4,757,359 | 7/1988 | Chiao et al. | 357/23.5 |
| 4,780,670 | 10/1988 | Cherry | 324/158 |
| 4,786,904 | 11/1988 | Graham, III et al. | 340/825 |
| 4,789,760 | 12/1988 | Koyama et al. | 174/68.5 |
| 4,791,075 | 12/1988 | Lin | 437/209 |
| 4,792,835 | 12/1988 | Sacarisen et al. | 357/23.6 |
| 4,796,074 | 1/1989 | Roesner | 357/51 |
| 4,796,075 | 1/1989 | Whitten . | |
| 4,799,128 | 1/1989 | Chen | 361/414 |
| 4,803,595 | 2/1989 | Kraus et al. | 361/412 |
| 4,808,967 | 2/1989 | Rice et al. . | |
| 4,821,142 | 4/1989 | Ushifusa et al. . | |
| 4,823,181 | 4/1989 | Mohsen et al. . | |
| 4,829,404 | 5/1989 | Jensen | 361/398 |
| 4,839,864 | 6/1989 | Fujishima | 365/200 |
| 4,840,923 | 6/1989 | Kinbara . | |
| 4,840,924 | 6/1989 | Kinbara | 437/189.5 |
| 4,841,099 | 6/1989 | Epstein et al. | 174/68.5 |
| 4,845,315 | 7/1989 | Stopper | 361/428 |
| 4,847,732 | 7/1989 | Stopper et al. . | |
| 4,864,165 | 9/1989 | Hoberman et al. | 307/467 |
| 4,873,506 | 10/1989 | Gurevich | 257/529 |
| 4,874,711 | 10/1989 | Hughes et al. | 437/8 |
| 4,876,220 | 10/1989 | Mohsen et al. . | |
| 4,881,114 | 11/1989 | Mohsen et al. | 357/54 |
| 4,882,611 | 11/1989 | Blech et al. | 357/51 |
| 4,888,574 | 12/1989 | Rice et al. . | |
| 4,888,665 | 12/1989 | Smith | 361/400 |
| 4,892,776 | 1/1990 | Rice . | |
| 4,893,167 | 1/1990 | Boudou et al. | 357/51 |
| 4,897,836 | 1/1990 | Fitzpatrick et al. | 370/112 |
| 4,899,205 | 2/1990 | Hamdy et al. | 357/51 |
| 4,910,418 | 3/1990 | Graham et al. | 307/465 |
| 4,914,055 | 4/1990 | Gordon et al. | 437/192 |
| 4,915,983 | 4/1990 | Lake et a. | 427/98 |
| 4,916,809 | 4/1990 | Boudou et al. | 29/852 |
| 4,920,454 | 4/1990 | Stopper et al. | 361/398 |
| 4,924,287 | 5/1990 | Orbach | 357/51 |
| 4,933,738 | 6/1990 | Orbach et al. | 257/529 |
| 4,935,584 | 6/1990 | Boggs | 174/262 |
| 4,937,475 | 6/1990 | Rhodes et al. . | |
| 4,943,538 | 7/1990 | Mohsen et al. | 437/52 |
| 4,949,084 | 8/1990 | Schwartz et al. | 340/825.83 |
| 4,969,124 | 11/1990 | Luich et al. | 375/201 |
| 4,974,048 | 11/1990 | Chakravorty et al. | 357/40 |
| 4,977,357 | 12/1990 | Shrier | 338/21 |
| 4,992,333 | 2/1991 | Hyatt . | |
| 5,003,486 | 3/1991 | Hendel et al. | 364/483 |
| 5,014,002 | 5/1991 | Wiscombe et al. | 324/158 F |
| 5,027,191 | 6/1991 | Bourdelaise et al. | 357/74 |
| 5,030,113 | 7/1991 | Wilson | 439/80 |
| 5,055,321 | 10/1991 | Enomoto et al. | 427/98 |
| 5,055,973 | 10/1991 | Mohsen . | |
| 5,060,116 | 10/1991 | Grobman et al. | 361/474 |
| 5,068,634 | 11/1991 | Shrier . | |
| 5,072,289 | 12/1991 | Sugimoto et al. | 257/793 |
| 5,077,451 | 12/1991 | Mohsen . | |
| 5,087,589 | 2/1992 | Chapman et al. | 437/195 |
| 5,092,032 | 3/1992 | Murakami | 29/830 |
| 5,097,593 | 3/1992 | Jones et al. | 29/852 |
| 5,099,149 | 3/1992 | Smith | 307/465 |
| 5,099,380 | 3/1992 | Childers et al. . | |
| 5,106,773 | 4/1992 | Chen et al. | 437/51 |
| 5,120,679 | 6/1992 | Boardman et al. | 437/195 |
| 5,142,263 | 8/1992 | Childers et al. . | |
| 5,144,567 | 9/1992 | Oelsch et al. . | |
| 5,148,265 | 9/1992 | Khandros et al. | 357/80 |
| 5,148,355 | 9/1992 | Lowe et al. | 361/410 |
| 5,155,577 | 10/1992 | Chance et al. | 357/71 |
| 5,166,556 | 11/1992 | Hsu et al. | 307/465 |
| 5,181,096 | 1/1993 | Forouhi | 257/530 |
| 5,181,859 | 1/1993 | Foreman et al. | 439/225 |
| 5,189,387 | 2/1993 | Childers et al. . | |
| 5,196,724 | 3/1993 | Gordon et al. . | |
| 5,200,652 | 4/1993 | Lee . | |
| 5,218,679 | 6/1993 | Hasegawa et al. | 395/275 |
| 5,220,490 | 6/1993 | Weigler et al. | 361/409 |
| 5,229,549 | 7/1993 | Yamakawa et al. | 174/262 |
| 5,233,217 | 8/1993 | Dixit et al. | 257/530 |
| 5,248,517 | 9/1993 | Shrier et al. . | |
| 5,250,228 | 10/1993 | Baigrie et al. | 252/511 |
| 5,250,470 | 10/1993 | Yamaguchi | 437/211 |
| 5,258,643 | 11/1993 | Cohen . | |
| 5,260,519 | 11/1993 | Knickerbocker et al. | 174/262 |
| 5,260,848 | 11/1993 | Childers . | |
| 5,262,754 | 11/1993 | Collins . | |
| 5,264,729 | 11/1993 | Rostoker et al. | 257/774 |
| 5,282,271 | 1/1994 | Hsieh et al. | 395/275 |
| 5,282,312 | 2/1994 | DiStefano et al. | 29/830 |
| 5,300,208 | 4/1994 | Angelopoulos et al. | 205/50 |
| 5,311,053 | 5/1994 | Law et al. | 257/529 |
| 5,317,801 | 6/1994 | Tanaka et al. | 29/830 |
| 5,319,238 | 6/1994 | Gordon et al. | 257/530 |
| 5,321,322 | 6/1994 | Verheyen et al. | 307/465.1 |
| 5,329,153 | 7/1994 | Dixit | 257/530 |
| 5,347,258 | 9/1994 | Howard et al. | 338/333 |
| 5,349,248 | 9/1994 | Parlour et al. | 307/465 |
| 5,362,676 | 11/1994 | Gordon et al. | 437/192 |
| 5,367,764 | 11/1994 | DiStefano et al. | 29/830 |
| 5,377,124 | 12/1994 | Mohsen | 364/489 |
| 5,397,921 | 3/1995 | Karnezos | 257/779 |
| 5,404,637 | 4/1995 | Kawakami | 29/843 |
| 5,409,865 | 4/1995 | Karnezos | 437/210 |
| 5,410,806 | 5/1995 | Schneider | 29/840 |
| 5,420,456 | 5/1995 | Galbi et al. | 257/529 |
| 5,420,460 | 5/1995 | Massingill | 257/693 |

| | | | |
|---|---|---|---|
| 5,435,480 | 7/1995 | Hart et al. | 228/180.1 |
| 5,438,166 | 8/1995 | Carey et al. | 174/261 |
| 5,464,790 | 11/1995 | Hawley | 437/60 |
| 5,481,795 | 1/1996 | Hatakeyama et al. | 29/852 |
| 5,487,218 | 1/1996 | Bhatt et al. | 29/852 |
| 5,502,889 | 4/1996 | Casson et al. | 29/830 |
| 5,654,564 | 8/1997 | Mohsen | 257/209 |

OTHER PUBLICATIONS

Yusuke Wada, "A New circuit Substrate For MCM–L", Toshiba Corp., ICEMCM '95, pp. 59–64.

Kenji Tsuda, "Matsushita Team Eliminates Holes in High–Density PCB", Nikkei Electronics Asia, Mar. 1995, pp. 69–70.

Patrick Johnston, "Printed Circuit Board Design Guidelines For Ball Grid Array Packages", Motorola, Inc., pp. 255–260.

Morrison, J.M., et al., "A Large Format Modified TEA $CO_2$ Laser Based Process for Cost Effective Small Via Generation", MCM '94 Proceedings, pp. 369–377, (1994).

Redmond, T.F., et al., "The Application of Laser Process Technology to Thin Film Packaging", IEEE, pp. 1066–1071, (1992).

Stopperan, J., "Rigid–Flex: The Old and The New", date unknown, (4 pages).

Joshua Silver, "High–Performance Scalable Switch Design," ASIC & EDA, Jun. 1994, pp. 38–48.

Esmat Hamdy, John McCollum, Shih–ou Chen, Steve Chiang Shafy Eltoukhy, Jim Chang, Ted Speers, and Amr Mohsen, "Dielecric Based Antifuse for Logic and Memory ICs," IEDM, 1988, pp. 786–789.

Steve Chiang, Rahim Forouhi, Wenn Chen, Frank Hawley,, John McCollum, Esmat Hamdy and Chenming Hu, "Antifuse Structure Comparison for Field Programmable Gate Arrays," IEEE, 1992, pp. 611–614.

Chenming Hu, Interconnect Devices for Field Programmable Gate Array, IEEE, 1992, pp. 591–594.

Kathryn E. Gordon and Richard J. Wong, "Condcting Filament of the Programmed Metal Electrode Amorphous Silicon Antifuse," IEEE, 1993, pp. 27–30.

Ali Iranmanesh, Steve Jurichich, Vida Ilderem, Rick Jerome, SP Joshi, Madan Biswal, Bami Bastani, Advanced Single Poly BiCMOS Technology for High Perfrormance Programmable TTL/ECL Applications, IEEE, 1990.

ASM Handbook, vol. 3, Alloy Phase Diagrams.

AMP Catalog, pp. 2253–2254.

Bernie DiMarco and Steve Hansen, "Interplay of Energies in Circuit Breaker and Fuse Combinations," 1991 IEEE, pp. 1765–1769.

James B. Gullette and Douglas M. Green, "Laser Personalization of NMOS Digital Topologies," Texas A&M University, 1983 IEEE, International Symposium on Circuits and Systems, pp. 1249–1252.

Wen–Jai Hsieh, Yih–Chyun Jeng, Chi–Song Horng and Keith Lofstrom, "I/O Buffering System to a Programmable Switching Apparatus," Official Gazette, Jan. 25, 1994, U.S. Patent 5,282,271, filed Jul. 6, 1992, divisional of parent filed Oct. 30, 1991.

Ron Iscoff, "Characterizing Quickturn Asics: It's Done With Mirrors," Semiconductor International, Aug. 1990.

Fred Ki, Raj Bachireddy, Darryl Jeong, Steve Cheng and Thu Nguyen, "An Ultra High Speed ECL Programmable Logic Device," IEEE 1990 Bipolar Circuits and Technology Meeting 3.1.

T. Lipski, "Distribution Fuses of Nearest Future," pp. 41–45.

R. Ranjan, G. Frind, C.E. Peterson and J.J. Carroll, "An Advancement in the Design and Application of Current–Limiting Fuses," pp. 36–40.

Masafumi Tanimoto, Junichi Murota, Yasuo Ohmori and Nobuaki Ieda, "A Novel MOS PROM Using a Highly Resistive Poly–Si Resistor," 1980 IEEE.

Paul C. Yu, Steven J. Decker, Hae–Seung Lee, Charels G. Sodini and John L. Wyatt, "CMOS Resistive Fuses for Image Smoothing and Segmentation," 1992 IEEE, IEEE Journal of Solid–State Circuits, vol. 27, No. 4, Apr. 1992, pp. 545–553.

Hae–Seung Lee and Paul Yu, "CMOS Resistive Fuse Circuits," pp. 109–110.

Chenming Hu, "Interconnect Devices for Field Programmable Gate Array", 1992, pp. 24.1.1–24.1.4.

Esmat Hamdy et al., "Dielectric Based Antifuse for Logic and Memory ICs", 1988, pp. 786–789.

Steve Chiang et al., "Antifuse Structure Comparison for Field Programmable Gate Arrays", 1992, pp. 24.6.1–24.6.4.

Ali Iranmanesh et al., "Advanced Single Poly BiCMOS Technology for High Performance Programmable TTL/ECL Applicantions", 1990, 4 pages.

Kathryn E. Gordon et al., "Conducting Filament of the Programmed Metal Electrode Amorphouse Silicon Antifuse", IEEE 1993, pp. 93–27 to 93–30.

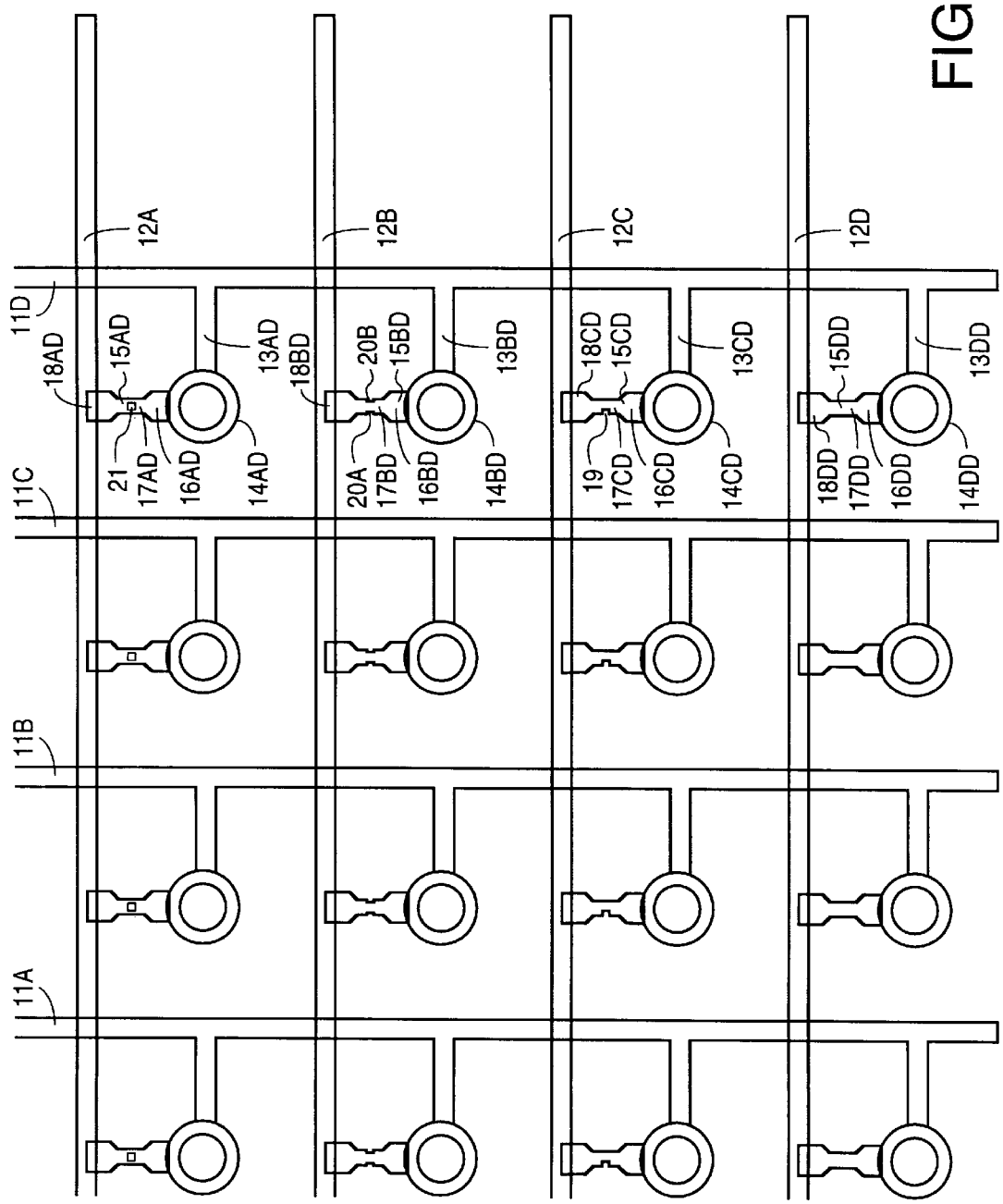

PCB/PWB/MCM/IC package process flow for forming fuse structures

| Steps : | Process Description |
|---|---|
| a. | (1) Deposit a conductive electrode layer on PCB core<br>(2) Apply a mask |
| b. | Etch and strip the mask to form the electrode traces |
| c. | Prepare electrode surface by optionally depositing an interfacial conductive layer |
| d. | (1) Apply mask dry film and open pads, traces, and fuse locations<br>(2) Deposit fuse layer (solder, or Ni, or Ni/Sn)<br>(3) Strip mask dry film of step d(1)<br>(4) Use fuse layer of step d(2) as a mask to etch interfacial layer formed in step c |
| e. | Repeat any of steps a-d as necessary, to generate multiple fuses and/or electrode traces in a multilayered structure |
| f. | Laminate multilayered structure together with other circuit board layers |
| g. | Generate external pattern and vias, plate via holes and make connections |

FIG. 3

PCB/PWB/MCM/IC package process flow for forming antifuse structures

| Steps : | Process Description |
|---|---|
| a. | (1) Deposit a conductive electrode layer on PCB core<br>(2) Apply a mask |
| b. | Etch and strip the mask to form lower electrode traces |
| c. | Prepare electrode surface by optionally depositing an interfacial conductive layer |
| d. | Deposit antifuse dielectric layer |
| e. | Optionally deposit an interfacial conductive layer |
| f. | (1) Deposit a top electrode layer<br>(2) Apply a mask<br>(3) Etch and strip mask to form upper electrode traces |
| 9. | Repeat any of steps a-f as necessary to form a multilayered structure |
| h. | Laminate multilayered structure together with other circuit board layers |
| i. | Generate external pattern and vias, plate via holes and make connections |

FIG. 6

PROGRAMMABLE/REPROGRAMMABLE PRINTED CIRCUIT BOARD USING FUSE AND/OR ANTIFUSE AS INTERCONNECT

This application is a continuation of application Ser. No. 08/194,110, filed Feb. 8, 1994, abandoned.

FIELD OF INVENTION

This invention relates to the field of field programmable logic structures. More specifically, this invention describes a new method of incorporating fuse and/or antifuse structures into a printed circuit board to make the printed circuit board programmable.

BACKGROUND OF THE INVENTION

Programmable logic on integrated circuits was introduced and popularized during the 1970's. Programmable array logic (PAL) and programmable logic devices (PLD) utilized advanced semiconductor processing technology, and enabled customers to purchase standard off-the shelf circuits that were essentially blank, and customize the circuits at the customer location. Unfortunately, the small density of these circuits limited the size and complexity of the designs.

Programmable elements such as fuses are well known for use in semiconductor devices, such as PLDs. See, for example, "Advanced Single Poly BiCMOS Technology for High Performance Programmable TTL/ECL Applications" by Iranmanesh, et al. IEEE 1990 Bipolar Circuits and Technology Meeting. Semiconductor fuse materials include Ti—W and Pt—Si, (see U.S. Pat. No. 4,796,075).

In addition to PALs, PLDs and fuses, Application Specific Integrated Circuits (ASICs) can be used to implement custom logic. The ASICs market exploded during the 1980's with the popularization of the masked gate array. A gate array employed a standard base array which could be stored in inventory and then metallized in accordance with the needs of a particular customer to form a desired logic circuit. Gate array technology enabled complex functions to be designed and delivered within weeks. The masked gate array however, did not give the system designers the flexibility and time-to-market advantage of the PLDs and PALs which were field programmable.

This limitation of ASICs fostered the birth of the Field Programmable Gate Arrays (FPGAs) in the early to mid 1980's. Integrated circuit programmable logic has been built using programmable elements such as, for example, SRAMs (static random access memory), EPROMs (electrically programmable read only memory), fuses and antifuses. Antifuse materials typically used in the semiconductor field include silicon oxide/silicon nitride composites (see, for example, U.S. Pat. Nos. 4,823,181, 4,876,220 and 5,258,643), and amorphous silicon (see, for example, U.S. Pat. Nos. 4,914,055 and 5,196,724). Properties and structures of such antifuse materials are described in the prior art (see, for example, "Dielectric Based Antifuse for Logic and Memory ICs" by Hamdy, et. al., 1988 International Electronic Devices Meeting (IEDM); "Antifuse Structure Comparison for Field Programmable Gate Arrays" by Chiang, et. al. 1992 IEDM; "Interconnect Devices for Field Programmable Gate Array" by Hu, 1992 IEDM; "Conducting Filament of the Programmed Metal Electrode Amorphous Silicon Antifuse" by Gordon, et. al. 1993 IEDM).

Several attempts have also been made to build programmable printed circuit boards (PCBs) and multichip modules (MCMs) as described in U.S. Pat. Nos. 5,055,973, 5,077,451, 4,458,297 and 4,847,792. Programmable printed circuit boards can be built utilizing integrated circuits (silicon chips made using semiconductor technology) at key locations throughout a PCB for switching signals into various programmable paths on the printed circuit board (PCB) as described in U.S. Pat. Nos. 5,055,973, 5,077,451 and Aptix Data Book (Feb. 1993) available from Aptix Corporation, 2880 N. First Street, San Jose, Calif. 95134. The wiring paths in the PCB are directed to and from these programmable silicon chips. However, silicon switches are highly resistive in comparison to circuit substrates and are expensive, adding to the cost of a PCB.

In U.S. Pat. Nos. 4,458,297 and 4,847,792, a silicon circuit board (SCB) with programmable switches was provided and other silicon devices were mounted on top of the SCB. Eventually the SCB was packaged and resulted in a programmable multichip module (MCM) package. The silicon circuit board as well as switches were made using semiconductor IC technology.

For ceramic packages, methods of making engineering change contact pads on a top surface have been described in U.S. Pat. No. 4,840,924 to Kinbara. However, such prior art contact pads are provided on a top surface layer, are cut by mechanical or laser cutting and have connection conductor portions to connect a wire for making the wiring change.

The approaches mentioned above for programmable PCBs, SCBs, MCMs and ceramic packages have several drawbacks. For example, their time-to-market is slow and their cost is high. Therefore a new approach is necessary.

SUMMARY OF THE INVENTION

In accordance with the present invention, two types of programmable elements, a fuse and an antifuse, can be used to inter-connect electronic components and chips mounted on a structure, such as, for example, a printed circuit board (PCB), a printed wiring board (PWB), a multi-chip module (MCM) or an integrated circuit (IC) package. Both types of programmable elements can be fabricated in a matrix as part of regular PCB, PWB, MCM, or IC package (such as pin grid array (PGA)) process flows. Such fabrication eliminates the use of silicon programmable chips or silicon programmable substrates made using semiconductor technologies. The cost is thus reduced substantially. In addition, fabrication compatibility with the PCB, PWB, MCM or IC package process flow enables faster time-to-market and better placement and routing architecture for the programmable PCB, PWB, MCM, or IC package.

One type of programmable element, a fuse, can include a thin layer of conductive material that disintegrates on programming; that is, on the application of electrical energy (voltage/current), heat energy (such as soldering iron), light energy (such as a laser beam or infrared beam) or mechanical energy (such as cutting). A fuse can include a metal trace of a desired thickness and geometry to minimize the real estate and maximize programming efficiency. Programming efficiency is improved by reducing the programming time and/or programming current.

In PCB, PWB, MCM, or IC package environment, fuse materials include, but are not limited to, materials used widely in the PCB, PWB, MCM or IC package environment such as, for example, copper, solder (Sn—Pb), nickel and gold. In addition, metals and alloys with low melting point are also good fuse materials. Tin and its alloys, lead and its alloys, thallium, zinc, antimony, magnesium, aluminum, or combinations of the above can be used as fuses. Fuses can be fabricated using regular PCB, PWB, MCM or IC package processes. For ceramic packages, the processing temperature can be higher compared to the temperature used in PCB, PWB, MCM or IC package processes. Therefore, for ceramic packages, fuse materials used in semiconductor integrated circuits such as Ti—W, Pt—Si can be used in addition to the materials described above for PCB, PWB, MCM or IC packages.

Another type of programmable element, an antifuse, an include a thin layer of non-conductive dielectric material sandwiched between two electrodes so that a conductive path is formed on programming (using electrical energy, light energy, heat energy or mechanical energy).

Antifuse materials in the PCB, PWB, MCM, or IC package environment include metal oxides, in which the oxide layer is created either by chemical reaction of, or physical deposition on top of, metal traces on the board, MCM, or package substrate. Materials that satisfy the antifuse requirements include epoxy resin, polyimide and metal oxides (such as, for example, aluminum oxide, magnesium oxide, or zirconium oxide).

In accordance with this invention, fuses and/or antifuses can be used to form a programmable burn-in board. The antifuse and/or fuse materials for a burn-in board are chosen to survive more severe temperature environments than operating conditions of a typical printed circuit board.

In accordance with this invention, fuses and antifuses can be used in matrices to form programmable logic structures. When both types of programmable elements are used together in a single structure, more efficient placement and routing architectures can take advantage of the characteristics of each type of programmable element. Furthermore, use of both fuses and antifuses together allows the architecture to be reprogrammable under some circumstances.

Use of fuses and/or antifuses as described above has several advantages. One advantage is that a very dense matrix of fuses and/or antifuses can be provided, so that by selectively blowing a fuse/antifuse, the matrix can be customized to achieve any desired circuit. Another advantage is that because the fuses and/or antifuses can be built into inner layers of a multi-layered structure, the uppermost surface is available for mounting electronic components and related custom traces. Another advantage is that to make any of the connections it is not necessary to manually connect any wires. Yet another advantage is that because an electrical programmer (based on voltage/current pulse) can be used to program the fuses/antifuses, the programming task is simplified.

BRIEF DESCRIPTION OF THE DRAWINGS

FIGS. 2A and 2B illustrate various fuse geometries in accordance with other embodiments of this invention.

FIG. 3 illustrates a process flow for forming fuses in a printed circuit board in accordance with one embodiment of this invention.

FIG. 6 illustrates a process flow for forming antifuses in a printed circuit board in accordance with one embodiment of this invention.

DETAILED DESCRIPTION

The success of the field programmable logic (memory) technologies for semiconductor devices has demonstrated that time-to-market with today's greatly reduced product life cycle has altered the planning strategy of today's technical companies. In accordance with this invention, we have recognized that it is advantageous to extend such a time-to-market concept from integrated circuits to printed circuit boards (PCBs), printed wiring boards (PWBs) multichip modules (MCMs) and IC package substrates. Although PCBs, PWBs, MCMs and IC packages are referenced in the following description, any structure for interconnection of one or more terminals of one or more electronic components can be built in accordance with this invention. Furthermore, any applications that require programmable logic substrates other than semiconductor substrates can be built in accordance with this invention.

Field programmable fuses and antifuses as described below are not known to have been attempted as part of PCBs. Also, fuses and antifuses as described below are not known to have been attempted as part of an inner-layer of PCBs, PWBs, MCMs or IC packages. Finally, electrically programmable fuses and antifuses as described below are not known to have been attempted as part of PCBs, PWBs, MCMs or IC packages.

The PCB, PWB, MCM and IC package environments limit manufacturing temperature to between 150° C. to 300° C. (except for ceramic packaging). None of the semiconductor fuse materials or ceramic fuse materials can be deposited within these temperatures because processing temperatures for such materials are well in excess of 350° C. or 400° C.

Therefore a new class of fuse materials is required for use with PCBs, PWBs, MCMs and IC packages. Moreover, greater efficiency and better time-to-market are achieved if the fuse materials for PCBs, PWBs, MCMs and IC package substrates are compatible with the PCB, PWB, MCM or IC package processing.

Figure 1:
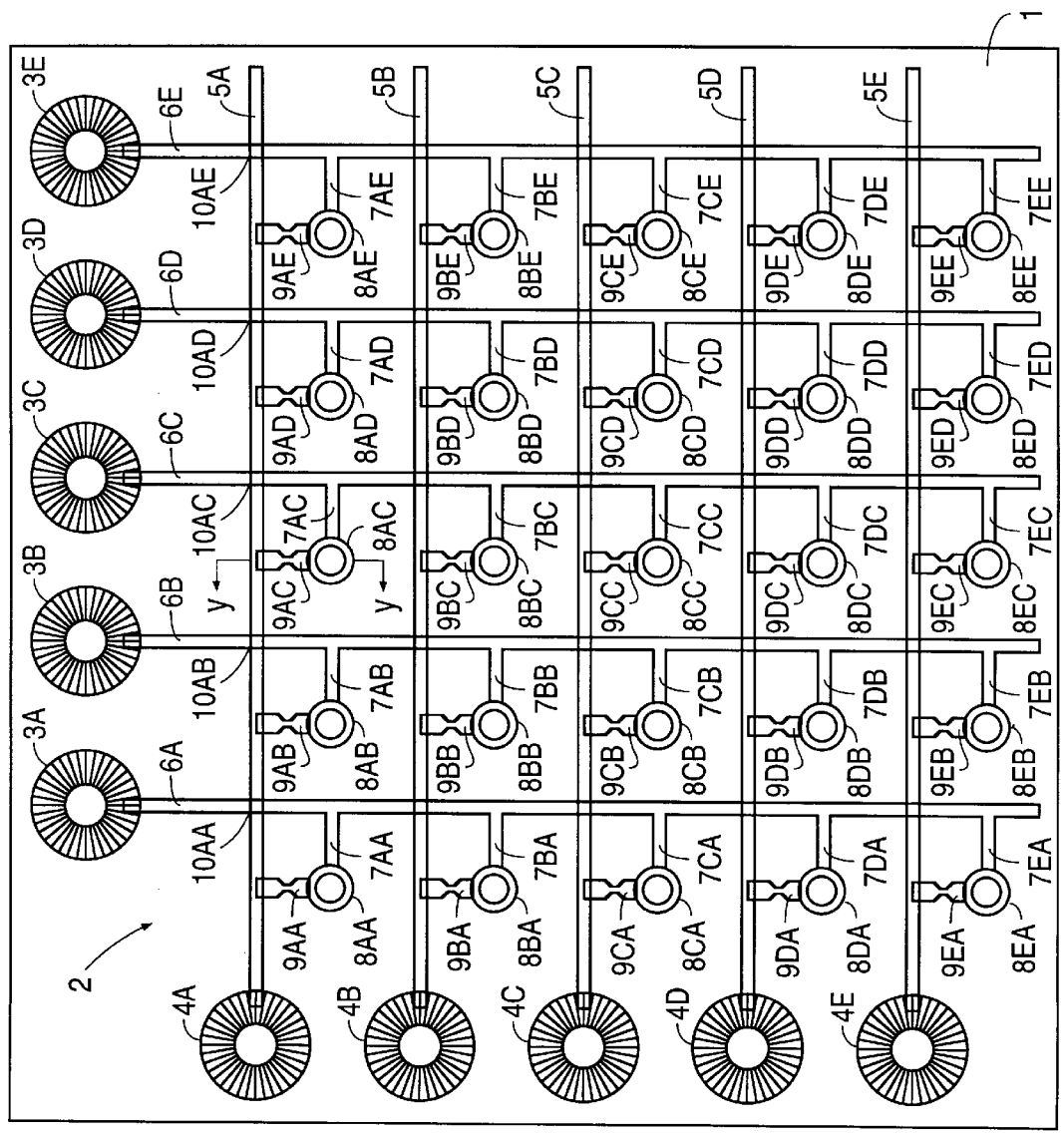
FIG. 1 illustrates a matrix of fuses manufactured on a printed circuit board in accordance with one embodiment of this invention.

FIG. 1 shows one embodiment of a printed circuit board 1 in accordance with this invention. Printed circuit board 1 is used for interconnecting electronic components such as, for example, one or more integrated circuits, resistors, transistors and capacitors to form a desired electronic circuit. As shown in FIG. 1, a printed circuit board 1 includes a matrix 2 of fuse elements 9AA to 9EE and conductive traces 5A to 5E and 6A to 6E together with via holes 3A–3E and 4A–4E designed to receive the terminals of an electronic component. Via holes 3A–3E are accessible from the upper-most exposed surface of the PCB and are connected to a set of parallel metal traces 6A–6E formed as part of an inner layer of the printed circuit board 1. Via holes 4A–4E are also accessible from the upper-most exposed surface of the PCB 1 and are connected to another set of parallel metal traces 5A–5E formed as part of a different inner layer of the printed circuit board 1 from the inner layer containing traces 6A–6E. Metal traces 5A–5E are insulated from metal traces 6A–6E at cross-over points, such as for example, 10AA–10AE (not all cross-over points are labeled in FIG. 1 for clarity).

Conductive connectors 7AA–7EE are formed as part of the same PCB layer as metal traces 6A–6E and connect metal traces 6A–6E to linking via holes 8AA–8EE. In the embodiment of FIG. 1, linking via holes 8AA–8EE are smaller than via holes 3A–3E and 4A–4E and are inaccessible from the upper-most surface of the PCB 1. Linking via holes 8AA–8EE are plated and are designed to connect conductive connectors 7AA–7EE to fuses 9AA–9EE. Fuses 9AA–9EE are formed in the same layer as, and are connected to, metal traces 5A–5E.

Although in the embodiment shown in FIG. 1, linking via holes 8AA–8EE are inaccessible from the upper-most surface of the PCB in another embodiment of this invention the linking via holes are accessible from the upper-most surface of the PCB. In another embodiment of this invention the linking via holes are designed to receive the terminals of an electronic component.

In the embodiment shown in FIG. 1, metal traces 5A–5E and 6A–6E are patterned in two sets of transverse parallel lines to form part of matrix 2. Therefore an electronic component's terminal in any via hole 3A–3E or 4A–4E is initially connected to terminals in every via hole 3A–3E and 4A–4E through one of fuses 9AA–9EE. For example, one path between via hole 4C and via hole 3E includes a fuse 9CE.

A fuse, such as fuse 9AA shown in FIG. 1, is a normally closed (i.e., conductive) switch element. To open (i.e., make nonconductive) the switch element electrical energy, heat energy or light energy (such as a laser beam or infrared beam) is applied to the switch element to disintegrate the electrically conductive member. In the embodiment shown in FIG. 1, each of fuses 9AA–9EE is an electric fuse that includes a central narrower separable portion that disintegrates on passage of a current of a selected magnitude for a selected duration. In accordance with this invention, a fuse can be formed of a variety of geometric shapes and from a variety of materials as discussed below in reference to FIGS. 2A, 2B, 3, 4A, 4B and Table 1.

To program the circuitry of FIG. 1, selected fuses are opened (blown or programmed) by using electrical energy (voltage/current). If a fuse is present on the upper-most surface of a PCB, PWB, MCM or IC package then the fuse can be opened by heat energy or light energy. For example, in FIG. 1, the fuse labeled 9BD is opened by application of a programming current source between via holes labeled 4B and 3D. Alternatively, if a fuse, such as for example, 9BD is formed on the upper-most surface layer, then such a fuse 9BD can be opened by direct application of a laser beam, infrared beam or mechanical cutting. On selectively opening fuses 9AA–9EE, the initial connections between via holes 3A–3E and 4A–4E are opened. Therefore any terminal of an electronic component in via holes 3A–3E can be left connected to any other terminal or terminals in via holes 4A–4E to achieve any desired interconnection pattern.

In one embodiment in accordance with this invention, a fuse for a PCB is 3 mils long, 3 mils wide, 300 microinches thick and formed of solder with an optional thin copper interfacial layer. The optional interfacial layer provides adhesion between the solder and the PCB substrate and is an integral part of the fuse. Such a PCB fuse has a resistance in the range of 1 to 1000 milli-ohm and is programmed by applying a current of 1 to 2 amperes for 10 to 1000 microseconds. To ensure an open circuit, the programming current can be applied for a longer duration (1 millisecond) depending on the fuse characteristics.

In accordance with this invention, the geometry (shape and size) of a fuse can be designed to ensure that the fuse functions effectively as a conductor if the fuse is not blown and functions as a completely open circuit if the fuse is blown. To blow a fuse, relatively higher current levels than used in normal operation are needed to avoid inadvertently blowing a fuse during normal operation of the fuse (when the fuse is not blown) as part of a circuit. A fuse must be designed with an appropriate programming current. If a fuse breaks down at a current below the "programming" current, an unintended open circuit can result, thereby disturbing normal operation of the existing circuit of which the fuse is a part. On the other hand if a fuse is over-resistant to the "programming" current, either an open circuit is not formed when desired or greater current must be applied to "blow" the fuse with attendant heat damage to other nearby structures of the PCB. Moreover, during the programming of a fuse, a large gap must be blown to prevent a fuse from later becoming closed due to accumulation of conducting material near the blown gap which could result in intermittent transmission of leakage current through the otherwise blown fuse. Various fuse geometries can be used to achieve a fuse with a desired programming time and current. Fuse geometry is discussed below in reference to FIGS. 2A and 2B.

Although FIG. 1 shows metal traces 5A–5E as horizontal lines and metal traces 6A–6E as vertical lines to form part of a matrix 2, any other architectural arrangement can be used in accordance with this invention. For example, circular and radial/diagonal metal traces can also be used in addition to, or as alternatives to horizontal and vertical lines in accordance with this invention. Furthermore, although only two sets of parallel metal traces are shown in FIG. 1, any number of sets of metal traces in any orientation and any architecture can be used in accordance with this invention.

To program a fuse in a large matrix, a larger current needs to be applied than is necessary for blowing single fuse (because all the unprogrammed fuses conduct current). Therefore the line width of the conducting traces have to be larger for a large matrix than for a small matrix. In order to have smaller line widths, a large matrix can be segmented into a number of smaller matrices or arrays to accommodate limits imposed by fuse characteristics on the current carrying capacity. Such smaller matrices or arrays can be implemented on various layers of a multi-layered structure. Moreover, various place and route algorithms well known in the art can be used with any architecture to build an optimum routing network to minimize delay and improve routing efficiency in accordance with this invention.

Although metal traces are shown in figures, such as, for example, FIG. 1, any electrically conductive trace can be used in accordance with this invention. Also, although FIG. 1 shows via holes such as, for example via holes 3A–3E and 4A–4E, any type of component contacts (such as conductive pads or solder bumps) can be used for receipt of the terminals of an electronic component in accordance with this invention. Also, although linking via holes (such as, for example, via holes 8AA to 8EE in FIG. 1, 25A1 to 25A20, 25B1 to 25B20 and 25C1 to 25C20 in FIG. 2C, via holes 70 in FIGS. 5A to 5D, and via holes 110, 120, 122, 130 and 132 in FIG. 8) are shown connecting various features of different layers, any conductive element can be used in accordance with this invention.

Although only two layers of patterned metal traces 5A to 5E and 6A to 6E are shown in FIG. 1, any number of layers can be used in accordance with this invention. Additional layers of metal traces and fuses can provide additional connections and allow increased complexity in routing and circuitry. Moreover, additional layers of metal traces permit use of reduced real estate, especially if the line width of the traces poses a constraint. Also, transverse metal traces 5A–5E and 6A–6E can cross each other at cross-over points such as, for example, 10AA–10AD, so as to form an upper electrode layer and a lower electrode layer of an antifuse (as described below in reference to FIGS. 5A–5D, 6 and 7). Also in accordance with this invention, all metal traces and fuses can be formed in a single layer such that any two transverse traces avoid contact with each other at cross-over points by detouring to a lower or upper layer. In accordance with this invention, traces can detour to a lower or upper layer by using linking via holes.

Moreover, although the fuses of FIG. 1 are shown as having identical dimensions, fuses of different dimensions can be built on the same layer depending on the architectural requirement. For example, metal traces forming an array of power buses for power distribution can be connected to fuses of larger dimensions designed for larger current carrying capacity than fuses connected to signal lines. Furthermore, although a printed circuit board is shown in the appended figures, such as, for example, FIG. 1, multichip modules (MCMs) and IC packages can also be built and used in accordance with this invention.

Many advantages flow from the above described fuse matrix in a PCB, PWB, MCM or IC package. One advantage is that a customer can program the fuse matrix to achieve any desired interconnect structure in a PCB, PWB, MCM or IC package. Therefore, the same generalized fuse matrix can be used by different customers without the need for fabrication of customized traces. The above described matrix of fuses built in a PCB, PWB, MCM or IC package eliminates the need for a programmable interconnect chip or silicon programmable substrate made using semiconductor technologies and therefore the cost is reduced substantially. The fuse matrix also solves the time-to-market problem of in the prior art programmable PCBs, PWBs, MCMs and IC packages by allowing a PCB, PWB, MCM or IC package with a standard configuration to be programmed into a desired circuit configuration.

Among the advantages of the arrangement of metal traces 5A–5E and 6A–6E, conductive connectors 7AA–7EE, linking via holes 8AA–8EE and fuses 9AA–9EE in the embodiment shown in FIG. 1 are the low interconnect complexity, and the fact that the amount of real estate required is low because each fuse in any layer is located immediately adjacent to a linking via hole that connects to metal traces in another layer.

Figure 2B:
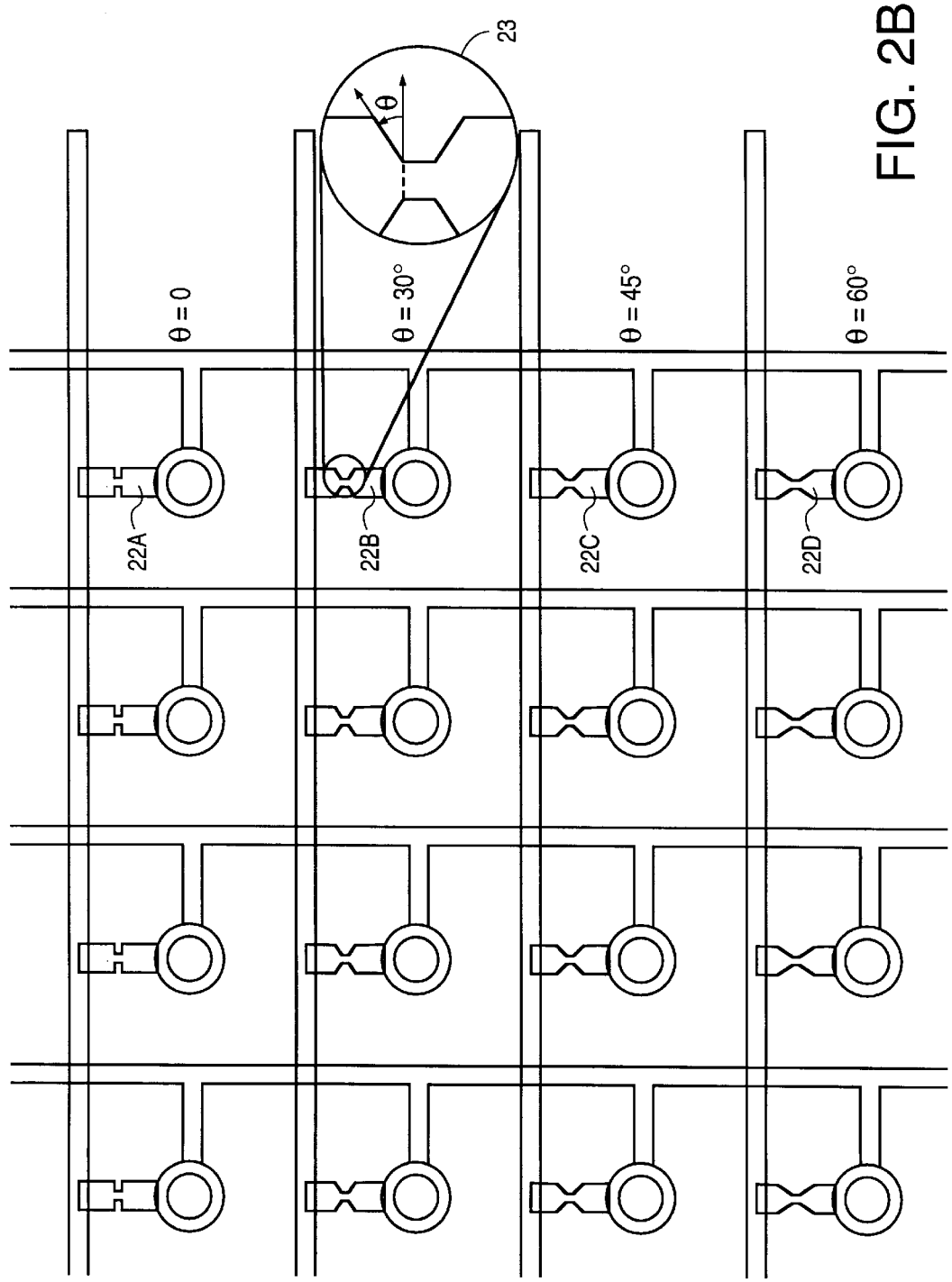

FIGS. 2A and 2B illustrate various fuse geometries in accordance with this invention. As shown in FIG. 2A, metal trace 12D is connected to metal trace 11D by fuse 15DD, linking via hole 14DD and conducting connector 13DD. Fuse 15DD has a narrow central separable portion 17DD and two broader connection portions 16DD and 18DD. A separable portion of a fuse, such as for example, section 17DD, is an electrical connection capable of being opened by programming employing voltage/current, heat, light source, or laser.

In one embodiment in accordance with this invention, the separable portion of a fuse is formed integral with the fuse's connection portions. In another embodiment in accordance with this invention, the separable portion is in electrical contact with the connection portions although the separable portion is formed separate and distinct from the connection portions.

Depending on the specific needs of a particular application, a separable portion of a fuse can be designed to provide the desired fuse blowing characteristics. For example, the time required to blow a fuse is dependent on the amount of local heat generated due to current flowing through the fuse as well as the distribution of the electric field intensity in the fuse. A separable portion of a fuse can have a geometry to increase the intensity of the electric field therein and to create high stress concentration areas therein which create higher local heat and thus reduce the programming time. For example, to reduce the programming time, fuse 15CD (FIG. 2A) is provided with a single sided notch 19 in central separable portion 17CD. In accordance with this invention, a fuse can have a notch of any shape such as, for example, a rectangle, a circular arc or a triangle.

Furthermore, in accordance with this invention, multiple notches can be provided in a separable portion of the fuse to increase the concentration of electric field in a fuse and the current flowing through a cross-section of the fuse. As shown in FIG. 2A, a fuse 15BD is provided with two notches 20A and 20B on both sides of a separable portion 17BD. If two notches in a fuse are sufficiently close to each other, the electric fields at the two notches interact due to adjacent boundary conditions and such interaction can further reduce the fuse programming time.

Furthermore, in accordance with this invention, a hole 21 can be provided in the center of a separable portion 17AD as shown for fuse 15AD in FIG. 2A. Holes in a fuse provide better control over fuse blowing characteristics and also provide better reliability during operation. For a given application, a hole size is selected considering the current carrying capacity, the desired fuse blowing characteristics, the process variations during fuse manufacture and misalignment tolerance between a hole edge and a fuse edge. In one embodiment of this invention, the hole diameter is 1 micrometer for a separable portion 6 micrometers wide. In another embodiment of this invention, the hole diameter is 3 mils for a separable portion 6 mils wide. If a fuse hole diameter is significantly larger than 50% of the width of the separable portion, then line width control of the separable portion can become a problem. For example, if due to misalignment a hole edge touches a fuse edge, a notch is formed instead of a hole. Furthermore, if a hole diameter is too large, the fuse has increased resistivity which reduces the current carrying capacity of the fuse.

Moreover, in accordance with this invention, a separable portion can be joined to the connection portions of a fuse at various taper angles θ (see inset 23 of FIG. 2B) such as for example 0°, 30°, 45° or 60° as shown for fuses 22A–22D. Taper angle θ can be optimized to obtain the reduced fuse blowing time or fuse blowing current for a given application.

In order for a fuse to properly disintegrate (i.e. "blow") on application of a programming current, in one embodiment in accordance with this invention, the fuse includes a metal trace of thickness in the range of 0.01 micrometer to 1 millimeter, width in the range of 0.1 micrometer to 10 millimeters and length in the range of 0.01 micrometer to 10 millimeters. Furthermore, in one embodiment in accordance with this invention, the diameter of linking via holes (such as 14AD to 14DD (FIG. 2A)) is 8 mils and the distance between two adjacent parallel metal traces is 20 mils. In another embodiment of this invention, the diameter of a linking via hole is 1 micrometer and the distance between two adjacent parallel traces is 2 micrometers.

In addition to choosing the appropriate fuse geometry and thickness, it is necessary to choose the appropriate fuse material. In accordance with this invention, a fuse (such as, for example one of fuses 9AA–9EE (FIG. 1), 15AD–15DD (FIG. 2A) and 22A–22D (FIG. 2B)) can be formed of any electrically conducting material. Forming fuses from materials widely used in the PCB environment such as for example, copper, solder (Sn—Pb) and nickel has the important advantage of fuse manufacture being compatible with standard PCB processing. Therefore, in accordance with this invention, a fuse can be formed using common PCB, PWB, MCM or IC package processes such as for example, electrolyte plating, electrodeless plating, physical or chemical vapor deposition and sputtering methods depending on the constraints and needs of a particular application. For example, electrolytic plating results in better quality of fuse material but results in loss of control on layer thickness and uniformity in geometry. On the other hand, although electrodeless plating provides better control on layer thickness, adhesion of the fuse layers is a problem. Finally, physical or chemical vapor deposition provide better control of both thickness and geometry but has the drawback of being too expensive.

In accordance with one embodiment of this invention, fuse blowing characteristics can be optimized without increasing resistance (1 to 1000 milli-ohm) by using fuse materials different from PCB, PWB, MCM or IC package materials. Such fuse materials include materials with melting points lower than 1000° C. Such low melting point fuse materials include, for example, tin, lead, thallium, zinc, antimony, magnesium and aluminum (see Table 1). Furthermore, alloys or combinations of such low melting point materials can also be used as fuse materials in accordance with this invention. Finally, in forming a fuse, optionally an interfacial layer can be used to improve adhesion of the fuse material to the PCB, PWB, MCM or IC package materials. For example, copper and/or nickel can be used to improve adhesion of solder or a low melting point fuse material to the PCB substrate.

Furthermore, in accordance with this invention, in addition to the fuse materials described above for PCB, PWB, MCM or IC packaging, fuse materials used in the semiconductor field such as for example, Ti—W or Pt—Si can be used for ceramic packages because ceramic layers can withstand high processing temperatures (over 800° C.) that are commonly required for these materials.

Several advantages flow from the use of fuses described above. One advantage is that fuse geometry can be used to minimize the real estate and maximize the programming efficiency while providing adequate current carrying capacity. Programming efficiency is improved by reducing the programming time and/or programming current. Moreover, the above described fuses permit the use of an electrical programmer so that a wire need not be manually added to make an electrical connection between the terminals of various electronic components. Also, the use of electrical programming permits the placement of a fuse on an inner layer of a PCB, PWB, MCM or IC package so that the uppermost surface is available for mounting electronic components or for forming custom traces.

Figure 2C:
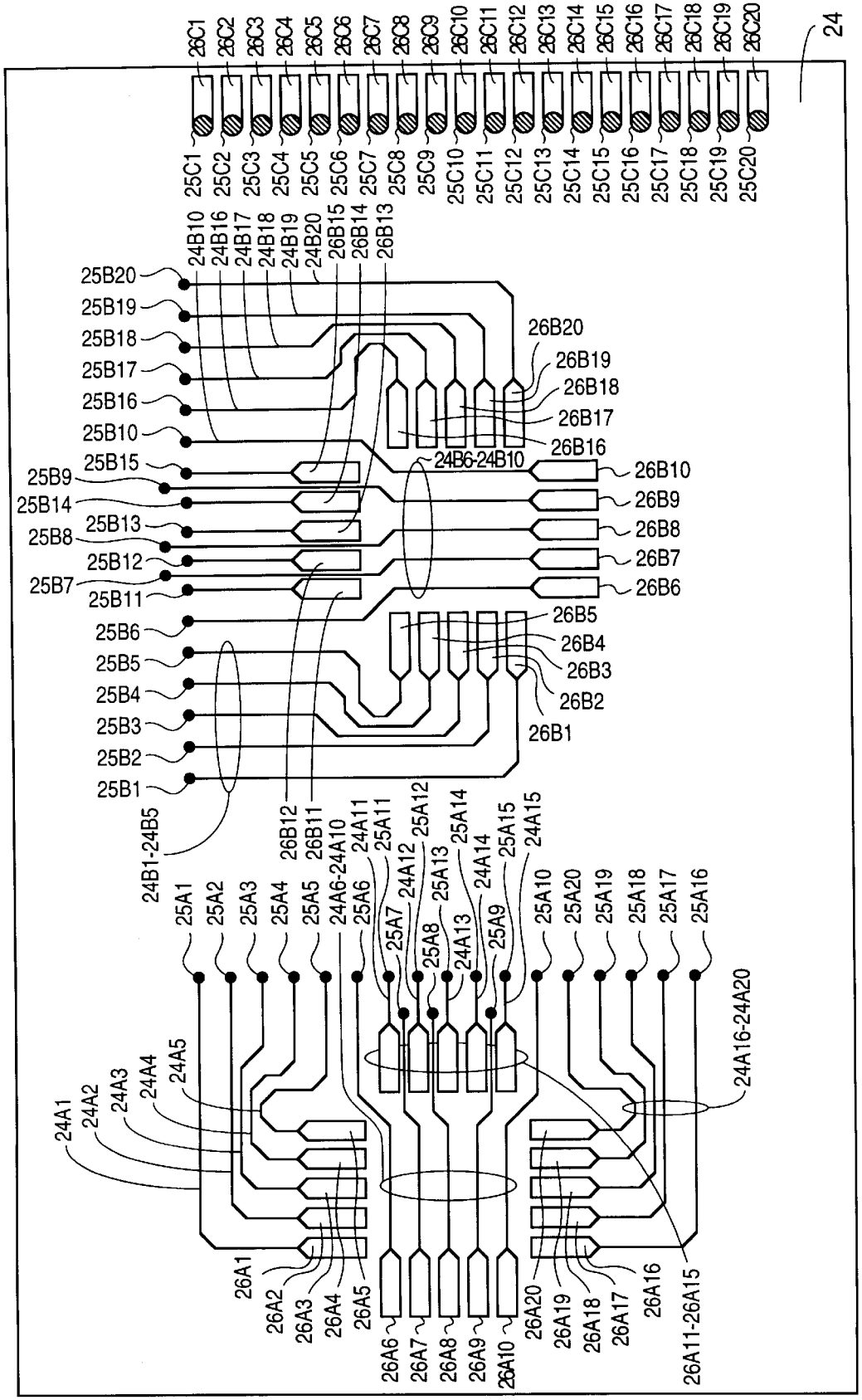
FIGS. 2C, 2D, 2E and 2F illustrate the traces and via holes of a multilayered printed circuit board in accordance with one embodiment of this invention.
Figure 2D:
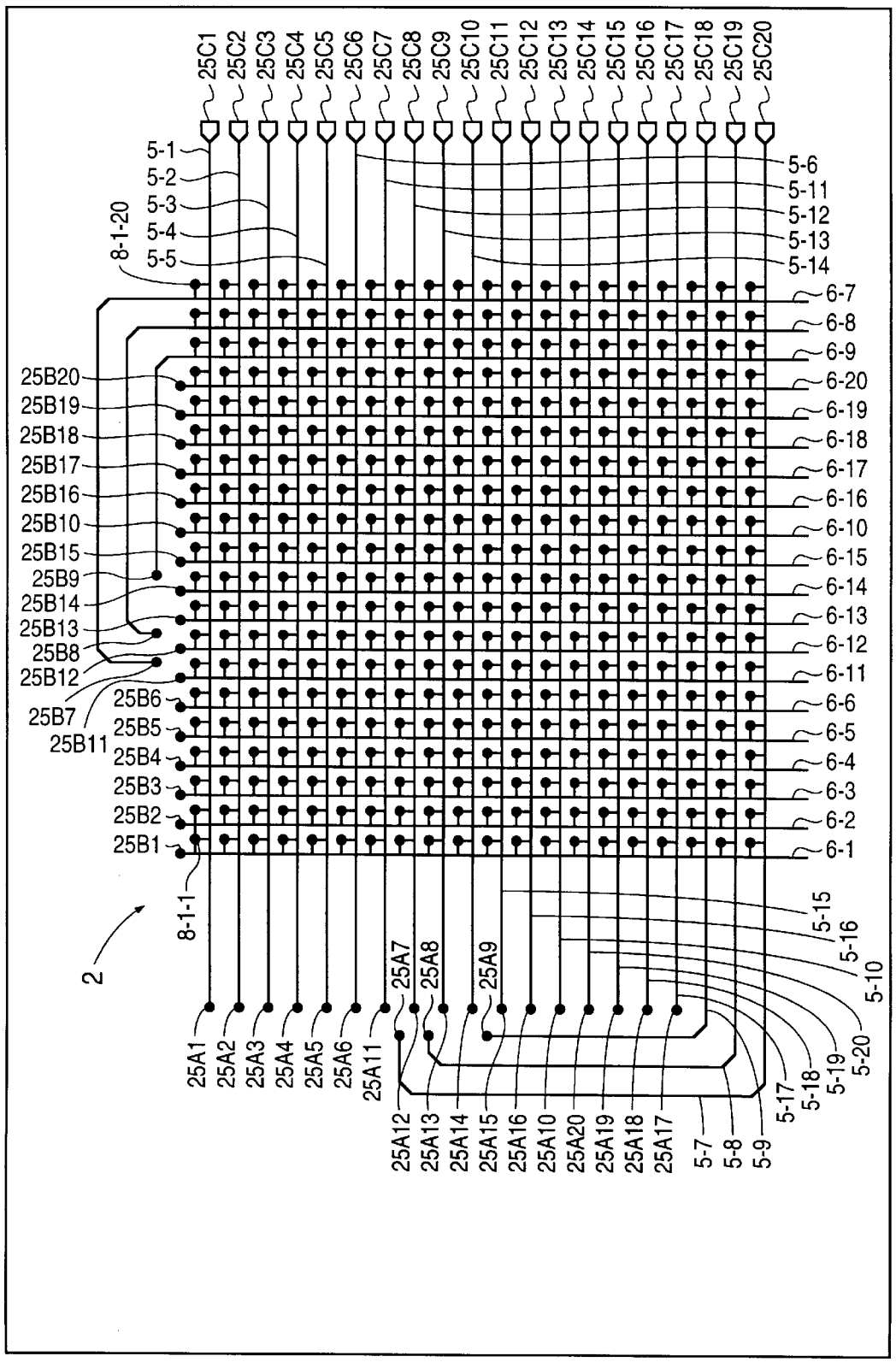
Figure 2E:
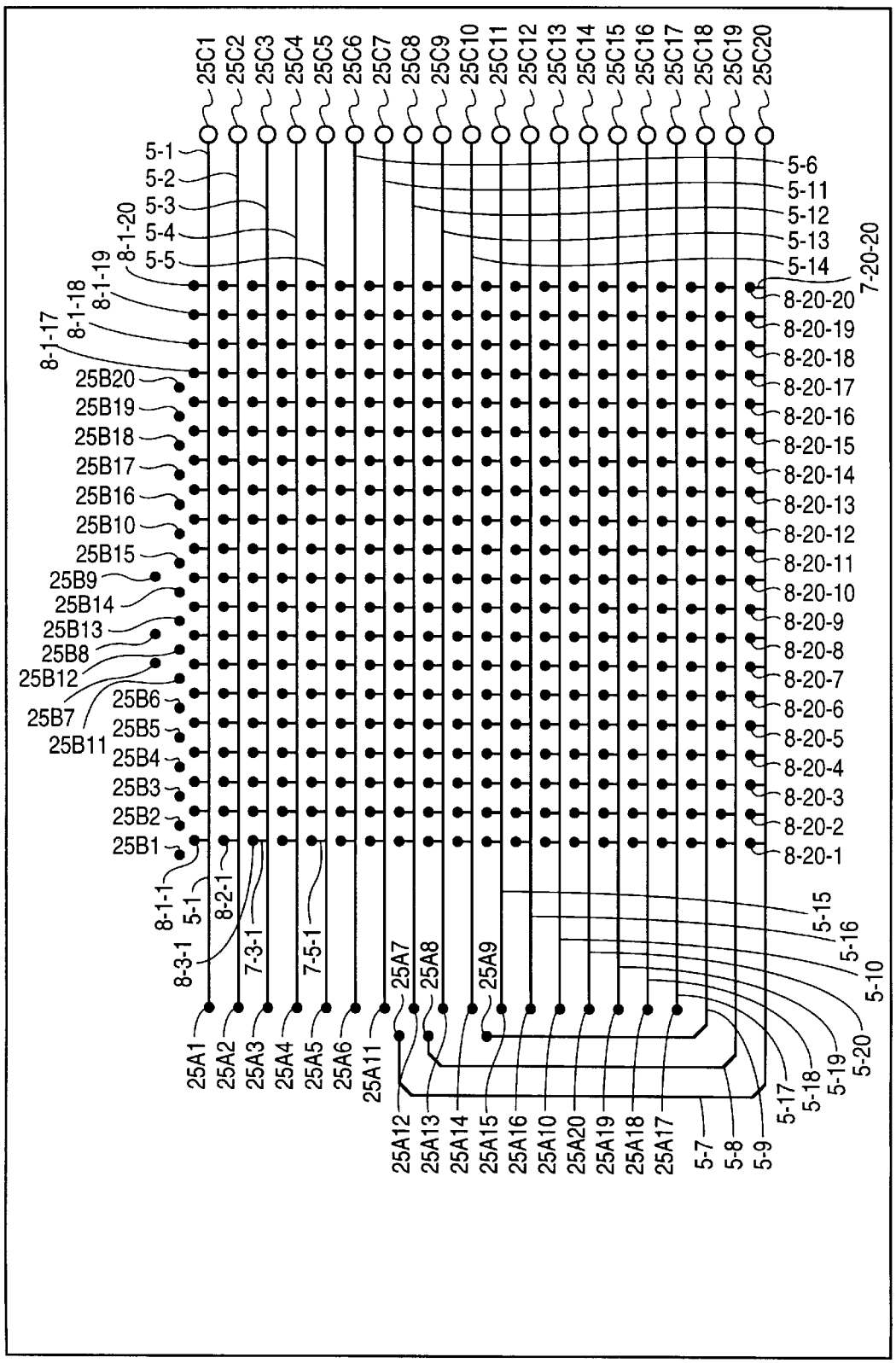
Figure 2F:
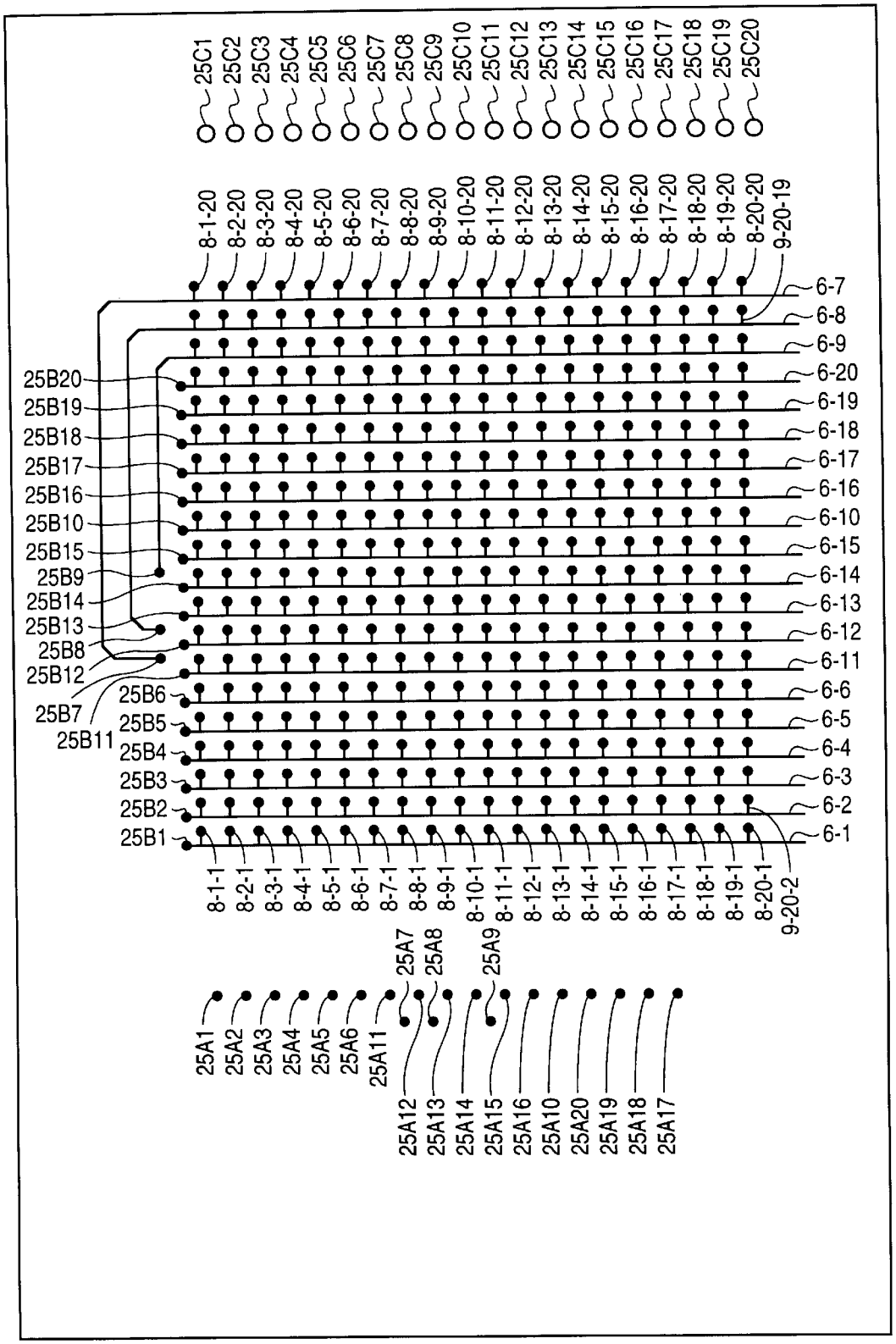

One embodiment of a printed circuit board in accordance with this invention is shown in FIGS. 2C, 2D, 2E and 2F. FIG. 2C shows the upper-most surface layer of a PCB showing via holes 25A1 to 25A20, connected by traces 24A1 to 24A20 respectively to mounting pads 26A1 to 26A20. Also shown in FIG. 2C are via holes 25B1 to 25B20, connected by metal traces 24B1–24B20 respectively to mounting pads 26B1–26B20. Mounting pads 26A1–26A20 and 26B1 to 26B20 are used for surface mounting of IC packages. Also shown in FIG. 2C are connector pads 26C1 to 26C20 (used for applying the programming current to the fuse matrix as described below) which are in electrical contact with conducting via holes 25C1 to 25C20. FIG. 2D illustrates a composite of two inner layers showing a fuse matrix 2 including metal traces 5-1 to 5-20, metal traces 6-1 to 6-20, fuses (not labeled for clarity) and conducting connectors (also not labeled) that are used to interconnect via holes 25A1 to 25A20 and via holes 25B1 to 25B20. As shown in FIG. 2D programming via holes 25C1 to 25C20 are connected to metal traces 5-1 to 5-20 respectively. The matrix 2 of FIG. 2D is formed of two layers shown in FIGS. 2E and 2F. As shown in FIG. 2E, metal traces 5-1 to 5-20 connect via holes 25A1 to 25A20 and via holes 25C1 to 25C20 to linking via holes (such as, for example, 8-1-1, 8-2-1, 8-1-17, 8-1-18, 8-1-19, 8-1-20 and 8-20-1 to 8-20-20; all the via holes in FIG. 2E are not labeled for clarity) through conducting connectors (such as, for example, 7-3-1, 7-5-1 and 7-20-20; again all conducting connectors are not labeled for clarity). As shown in FIG. 2F, traces 6-1 to 6-20 connect via holes 25B1 to 25B20 to linking via holes (such as, for example, via holes 8-1-1 to 8-20-1 and 8-1-20 to 8-20-20; again all via holes are not labeled for clarity) through fuses (such as, for example, fuses 9-20-2 and 9-20-19; all fuses are not labeled for clarity). Linking via holes (such as, for example, via holes 8-1-1 to 8-20-1 and 8-1-20 to 8-20-20) interconnect the metal traces of FIG. 2E and 2F to form the fuse matrix 2 of FIG. 2D.

Figure 4A:
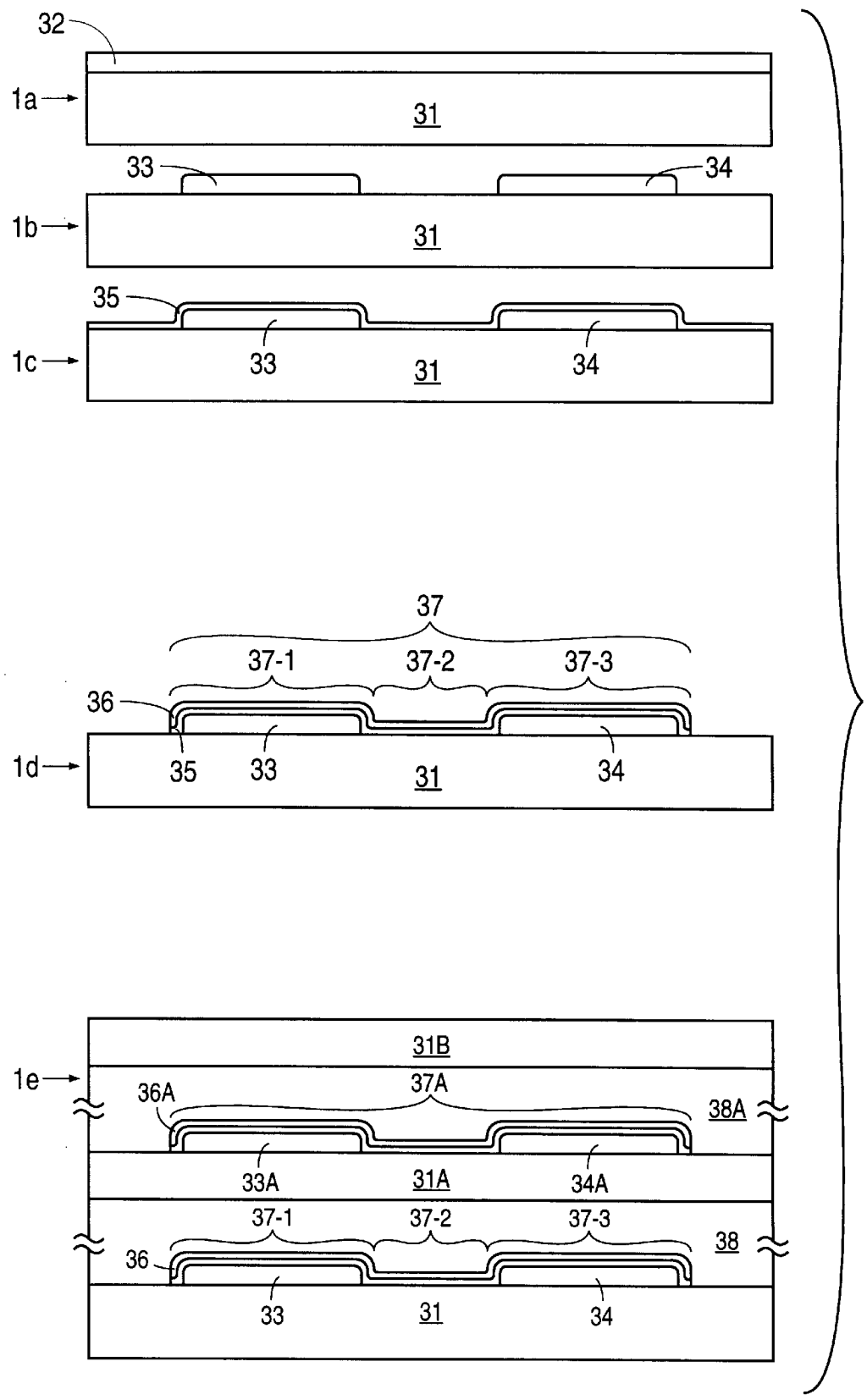
FIGS. 4A and 4B illustrate various cross-sections of a fuse structure formed in accordance with the process of FIG. 3.
Figure 4B:
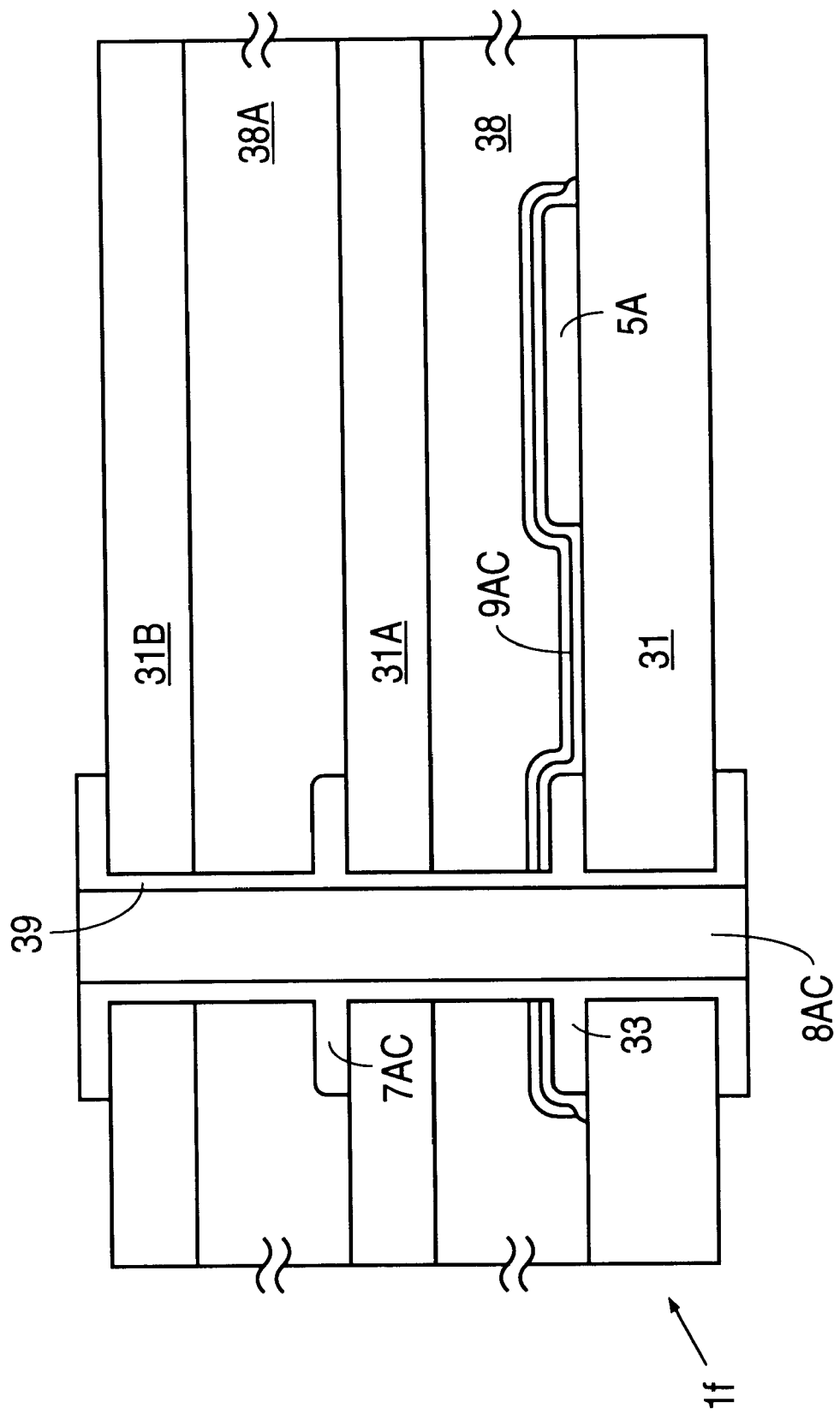

FIG. 3 is a process flow chart for incorporating a fuse into a PCB, PWB, MCM or IC package in accordance with this invention. FIG. 4A illustrates cross-sections 1a–1e of a PCB at the end of a corresponding step a–e of the process of FIG. 3. FIG. 4B illustrates a cross-section of PCB 1 of FIG. 1 taken in the direction Y—Y and formed in accordance with the process of FIG. 3.

As shown in FIG. 3 first, at step a, after a PCB core 31 (see PCB cross-section 1a of FIG. 4A) is formed by well known PCB process steps, a conductive electrode layer 32 is deposited on PCB core 31 and a mask is used to develop a pattern photo image (not shown) for forming metal traces and pads. PCB core 31 can be any electrically insulating substrate material (such as for example, epoxy resin, polyimide, alumina, magnesium oxide, zirconium oxide and can include a FIBER GLASS matrix for mechanical strength). If a polyimide substrate is chosen to form PCB core 31, higher temperatures (up to 350° C.) can be used for fuse fabrication in PCB processing. In MCM or IC packages, if a ceramic substrate is chosen to form a substrate 31, higher temperatures (over 800° C.) can be used for fuse fabrication in MCM or IC package processing. In step b, metal traces 33 and 34 (see PCB cross-section 1b of FIG. 4A) are formed by etching conducting layer 32 and stripping the mask. Next, in optional step c, an optional interfacial conductive layer 35 (for providing adhesion) can be blank deposited over the entire PCB (see PCB cross-section 1c of FIG. 4A).

A fuse 37 (with narrow central separable portion 37-2 and broader connection portions 37-1 and 37-3) is formed of fuse layer 36 in step d, by masking, depositing and etching in the following manner. First a mask (not shown) is deposited on the surface of the PCB that leaves open only the areas at which a fuse and the associated trace and via holes are to be formed (such as for example, in FIG. 1, the areas covered by traces 5A–5E, fuses 9AA–9EE and linking via holes 8AA–8EE). Next, fuse material such as, for example, solder is deposited over open areas of the mask. Then the mask layer is stripped away, removing with the mask by a lifting process the overlying conductive material but leaving on the PCB the conductive material formed in the mask openings on the PCB surface. Next the fuse material is used as a mask to etch away the blank deposited optional interfacial layer 35.

After a dielectric layer 38 (such as for example, a plastic resin) is deposited, the above described steps a–d (FIG. 3) can be repeated as often as necessary to produce, for example, the PCB cross-section 1e of FIG. 4A, having additional layers of substrate 31A and 31B, metal traces 33A and 34A and fuse 37A (formed of fuse layer 36A).

Next, linking via holes, such as, for example, via hole 8AC in PCB cross-section 1f of FIG. 4B, are made and plated with conductive material 39. Such linking via holes are formed by standard processes and techniques used in forming via holes for PCB, PWB, MCM or IC packages (such as, for example, drilling, physical or chemical etching). PCB cross-section 1f of FIG. 4B, illustrates a cross-section of PCB 1 of FIG. 1 in the direction Y—Y. Cross-section 1f of FIG. 4B can be formed from cross-section 1d of FIG. 4A by forming conducting connector 7AC and metal trace 5B (see FIG. 1) in the same manner as described above for metal traces 33 and 34. As shown in FIG. 4B, conducting material 39 in linking via hole 8AC connects metal trace 5A of a lower layer to conducting connector 7AC of an upper layer. In this manner, trace 5A is connected to trace 5B through conducting connector 7AC and fuse 9AC. Any necessary connections are made after the multilayered structure is fabricated to connect matrix 2 (FIG. 1) to other vias and custom circuits such as for example traces on the uppermost surface layer of the printed circuit board.

The above described method of fabrication of a fuse for a PCB, PWB, MCM or IC package has several advantages. Compatibility of fuse fabrication with the PCB or MCM or IC package process flow allows fuses to be made easily, enables faster speed for product life cycle which allows rapid prototyping, and permits better placement and routing architecture for the programmable PCB, PWB, MCM, or IC packages.

In addition to or as an alternative to the use of the fuses described above, the terminals of electronic components can also be interconnected through antifuses. An antifuse is a normally open switch element in which the electrical connection is established by applying electrical energy, heat energy or light energy to the non-conducting material to make it conducting. An antifuse can include a thin layer of non-conductive dielectric material sandwiched between two electrodes so that upon programming, a conductive path is formed in the dielectric material to connect the two electrodes.

There appear to be no known attempts to integrate antifuses into PCBs, MCMs, or IC package substrates (such as PGA's). One reason is that all known previous antifuses made by semiconductor technology had a thickness in the range of 100 Å to 1000 Å (0.1 μm). However, antifuses made by semiconductor technology are too thin for use in PCB, PWB, MCM or IC packaging. Antifuse thickness must be orders of magnitude larger (0.1 μm to 1 mm) in order to be manufacturable and useable in the PCB, PWB, MCM or IC package environment. Firstly, it is very difficult to manufacture such thin (100 Å to 1000 Å) layers of materials using standard PCB, PWB, MCM or IC package manufacturing processes. Secondly, maintaining mechanical integrity of the antifuse layers in the board or package environment is a major concern because PCBs, MCMs and IC packages are handled by hand and can easily get flexed. Finally, the antifuses used in semiconductor integrated circuits are created at high temperatures (300° C. to 800° C.) which are not normally available for plastic substrates used in PCBS, MCMs or IC packages (wherein the process temperatures are limited to around 150° C. or 250° C.).

Figure 5A:
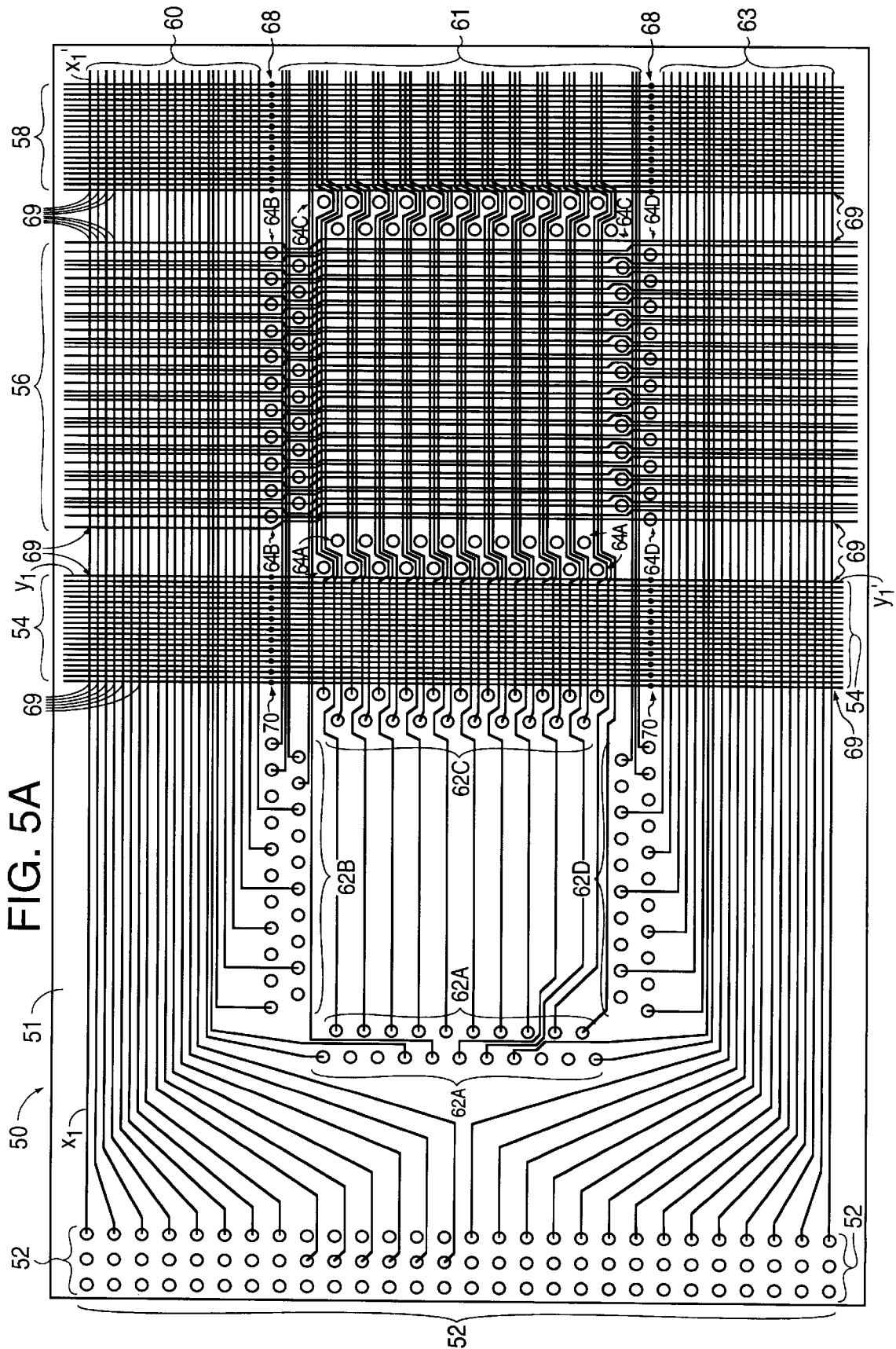
FIG. 5A illustrates a matrix of antifuses in a multi-layered printed circuit board in accordance with one embodiment of this invention.
Figure 5B:
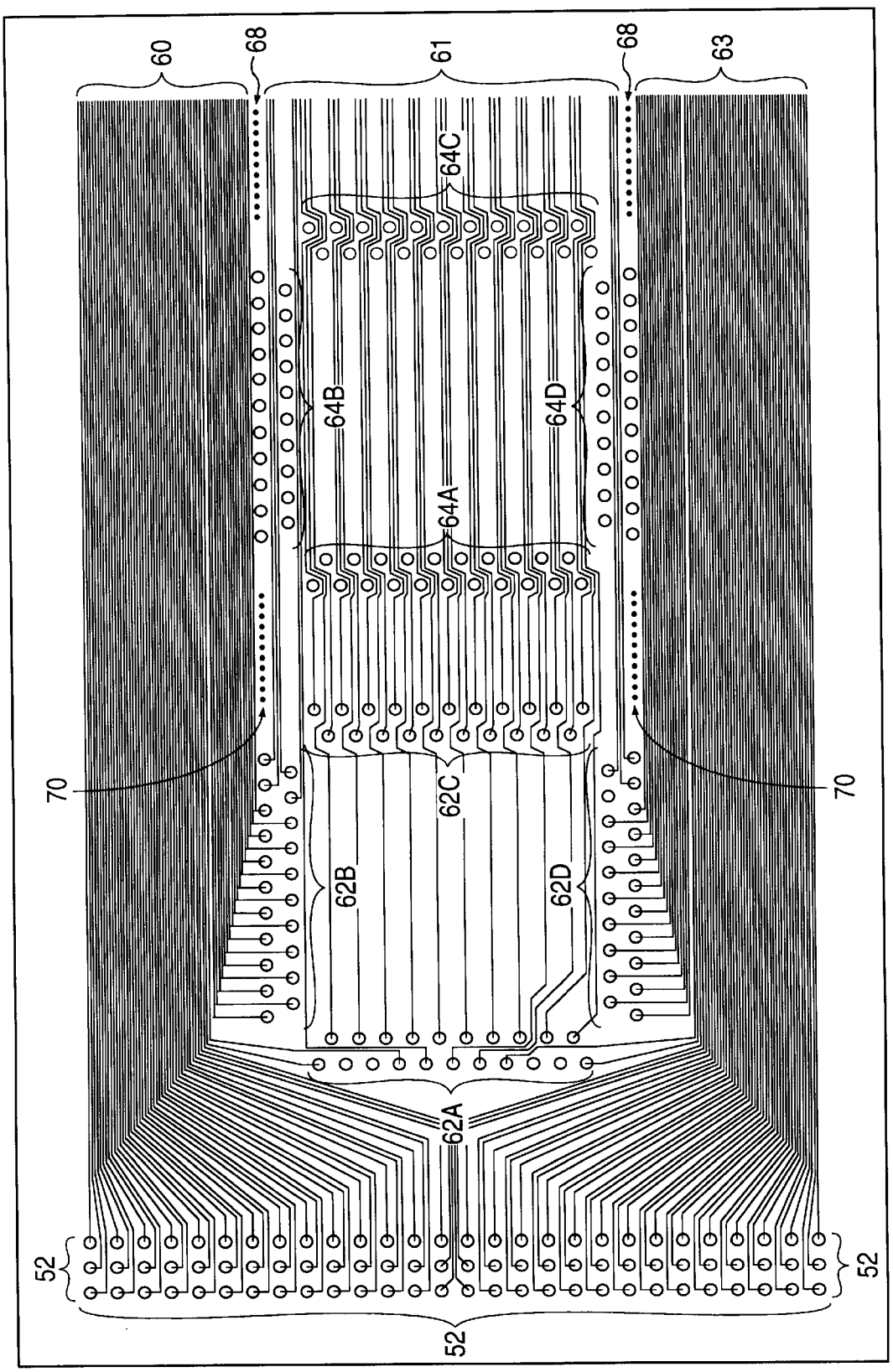
FIGS. 5B, 5C and 5D illustrate traces and via holes on each layer of the multi-layered printed circuit board of FIG. 5A.
Figure 5C:
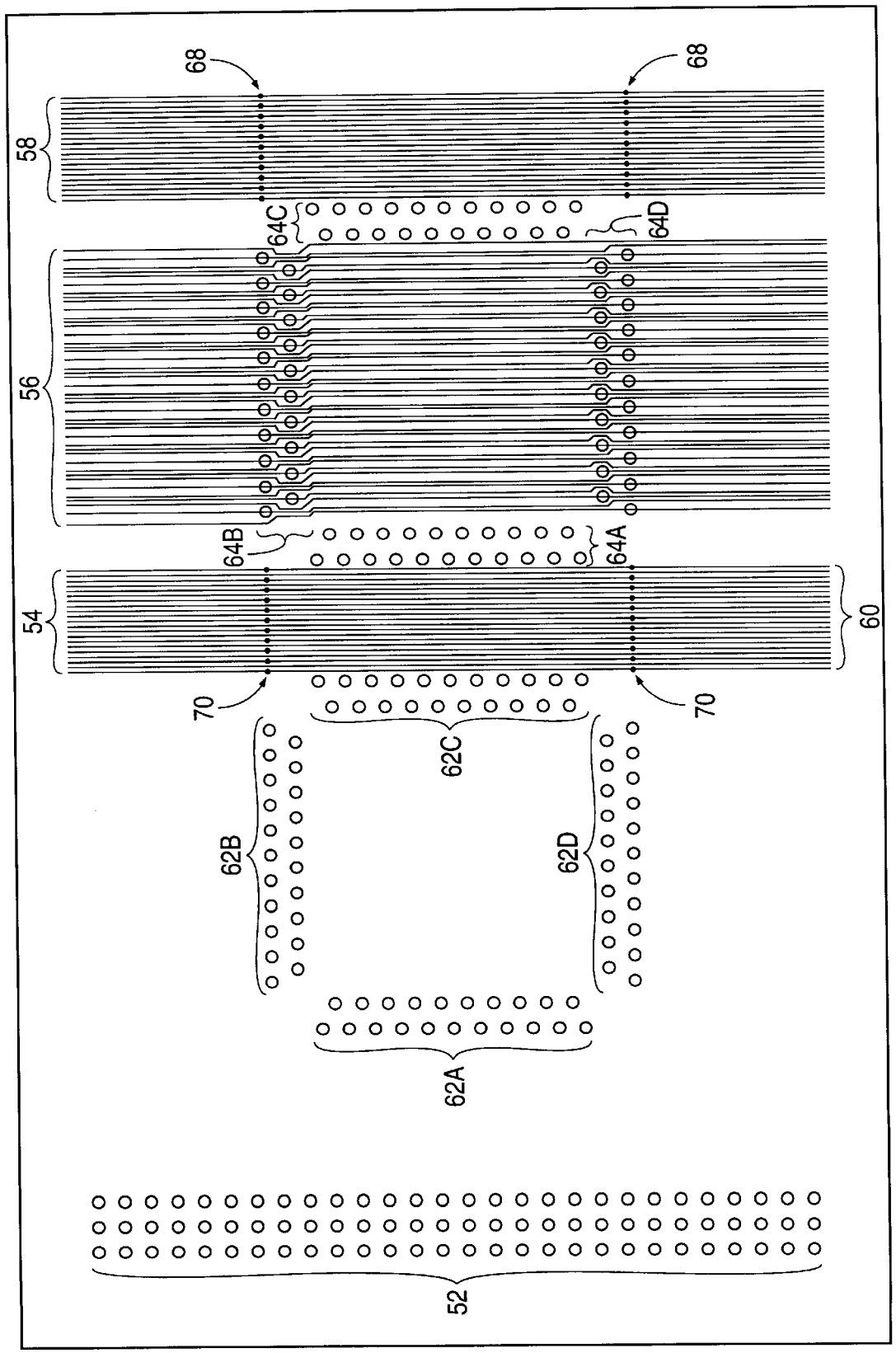
Figure 5D:
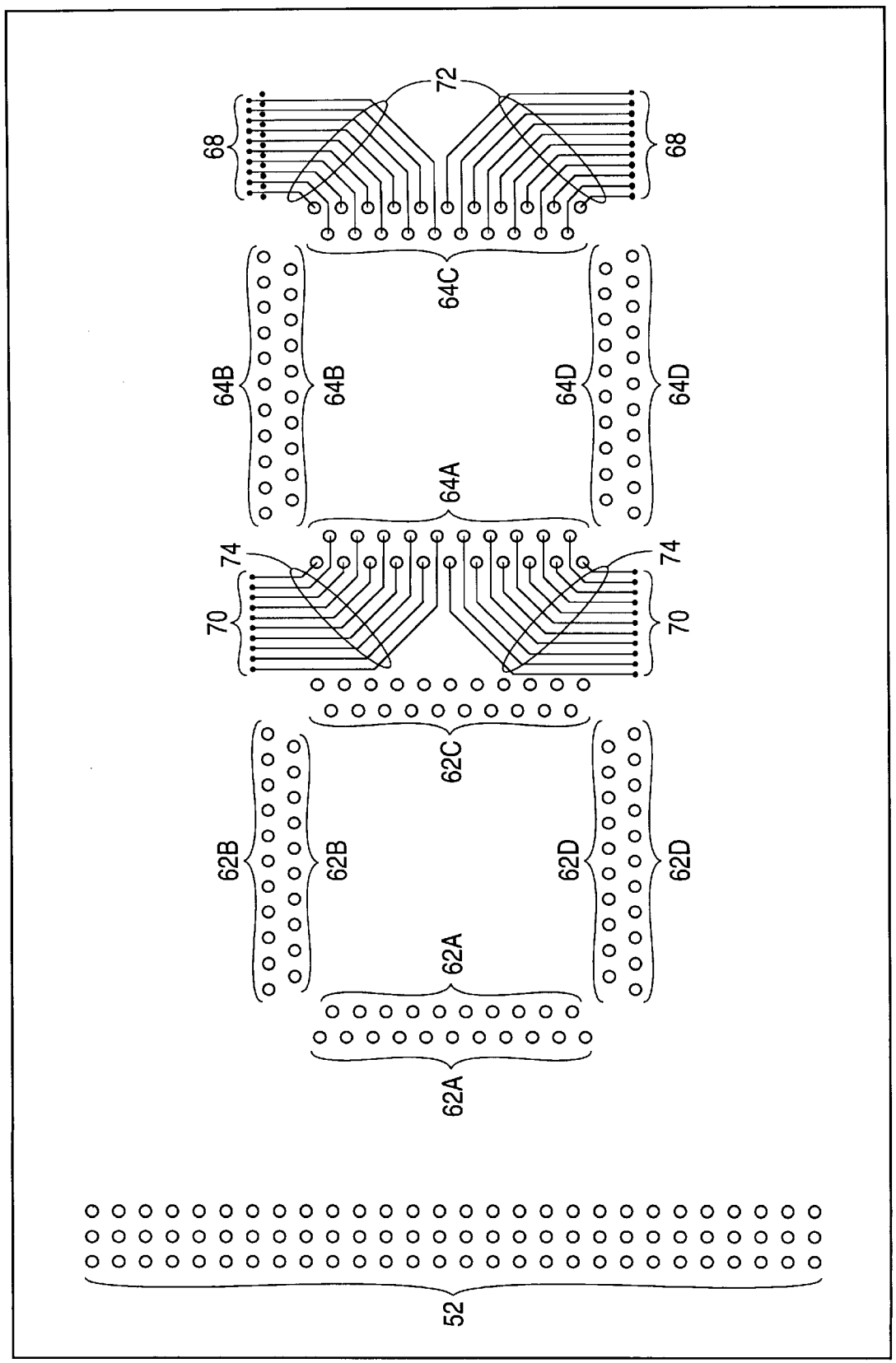

FIG. 5A illustrates matrices of antifuses manufactured in a printed circuit board in accordance with this invention. FIGS. 5B–5D illustrate traces and via holes in each layer of PCB 50 of FIG. 5A. As shown in FIG. 5A, a printed circuit board 50 includes a substrate 51 of electrically insulating material (such as, for example, epoxy resin, polyimide, alumina, magnesium oxide, zirconium oxide and can include a FIBERGLASS matrix for mechanical strength) on which are formed programming via holes 52, sets of metal traces 54, 56 and 58, orthogonal sets of metal traces 60, 61 and 63 and socket via holes 62A–62D and 64A–64D to receive the terminals of an electronic component. Antifuses 69 are formed in PCB 50 at each point at which a metal trace (also known as electrode trace) such as for example, trace $Y_1Y_1'$ of traces 54, crosses over another metal trace such as, for example, trace $X_1X_1'$ of traces 60. In FIG. 5A all of the antifuses 69 are not labeled for clarity. Linking via holes 70 (see FIGS. 5A–5D) are also formed in PCB 50 to connect metal traces 54 to other traces in various layers. Many metal traces and other features are not shown in FIG. 5A to simplify the drawing.

As shown in FIG. 5B, metal traces 60, 61 and 63 are formed as part of an inner upper electrode layer. As shown in FIG. 5C, metal traces 54, 56 and 58 are formed as part of an inner lower electrode layer. Any metal traces that cannot be accommodated on either the upper electrode layer or the lower electrode layer are formed as part of another layer (such as, for example, a bottom layer) and connected to the appropriate layer by linking via holes. FIG. 5D shows a bottom electrode layer in which are formed metal traces 72 and 74 that are connected by linking via holes 70 to metal traces 54 and 58 in the lower electrode layer of FIG. 5C.

Antifuses 69 of FIG. 5A are formed by providing antifuse dielectric materials between an upper electrode trace and a lower electrode trace. Antifuse materials for use in accordance with this invention include, but are not limited to, metal oxides. A metal oxide layer can be created either by chemical reaction of oxygen with metals or by physical deposition of metal oxide on top of metal traces on the printed circuit board, MCM or package substrate. Antifuse materials also include polymer materials such as for example, epoxy resin and polyimide. Polymer materials can be deposited using techniques such as for example, screen print, dry film and spin on.

In one embodiment in accordance with this invention, the thickness of an antifuse 69 (FIG. 5A) is in the range of 0.1 μm to 1 mm. If an antifuse is too thin, the antifuse cannot sustain the mechanical flexibility of a printed circuit board. If an antifuse is too thick, it takes a very long time to program. Also, if the antifuse is too thick, higher programming voltages are required which result in isolation problems. Therefore an increase in antifuse thickness increases the complexity of antifuse programming methodology. However, one advantage of a thick antifuse is that the antifuse has low capacitance with the resultant lower RC effects.

In one embodiment of this invention, the antifuse area is kept as small as permitted by the line width of the upper and lower electrode traces.

In accordance with one embodiment of this invention, an antifuse is programmed by applying a voltage pulse using a voltage source of between 10V to 1000V. Given the thickness in the range of 0.1 μm to 1 mm, the breakdown field of the antifuse is between 0.01 Mv/cm to 1 MV/cm (which is different from the 10 MV/cm typical for the semiconductor antifuses such as, for example, silicon oxide). Materials that satisfy these requirements for antifuses include but are not limited to epoxy resin, polyimide and metal oxide (for example, aluminum oxide, magnesium oxide, or zirconium oxide).

In accordance with this invention an antifuse at the intersection of conductive trace $Y_1Y_1'$ (see FIG. 5A), and orthogonal conductive trace $X_1X_1'$ is programmed by a voltage $V_x$ applied at $X_1$ and a voltage $-V_y$ applied at $Y_1$. As a result of these voltages, only the antifuse element at the intersection of $Y_1Y_1'$ and $X_1X_1'$ will receive the full programming voltage of $V_x+V_y$ and break down to form an interconnection therebetween with sufficiently low resistance (for example, resistance in the range of 1 milli-ohm to 100 ohms). A good interconnection can be accomplished by optimizing the programming voltage, current, time, antifuse material and electrode material.

Once the dielectric is ruptured, the resistance of the conductive state is determined by the size (i.e. the cross-sectional area and the length) of the conductive conduit (link). The size of the conductive link is determined by the amount of power dissipated in the link which melts the dielectric.

The antifuse matrix described above has several advantages. The antifuse matrix solves the speed and cost problems faced by previous attempts at field programmable PCB, PWB, MCM and IC packages. By eliminating the use of one or more silicon programmable chips or a silicon programmable substrate made using semiconductor technologies, the cost of the PCB, PWB, MCM or IC package is reduced substantially. In addition, the present approach can be adapted anywhere electrically conductive traces are patterned. Another advantage is that because the antifuses can be built into inner layers of a multilayered structure, the top surface is available for mounting electronic components and related custom traces. Another advantage is that no wires need to be connected to make any of the connections of an antifuse matrix. Instead, an electrical programmer (based on using voltage/current pulse) can be used to program the fuses and/or antifuses in the field and therefore, the programming task is simplified. Therefore customizing a programmable logic structure of fuses and/or antifuses in accordance with this invention does not require a manufacturing facility at the customer site.

Figure 7:
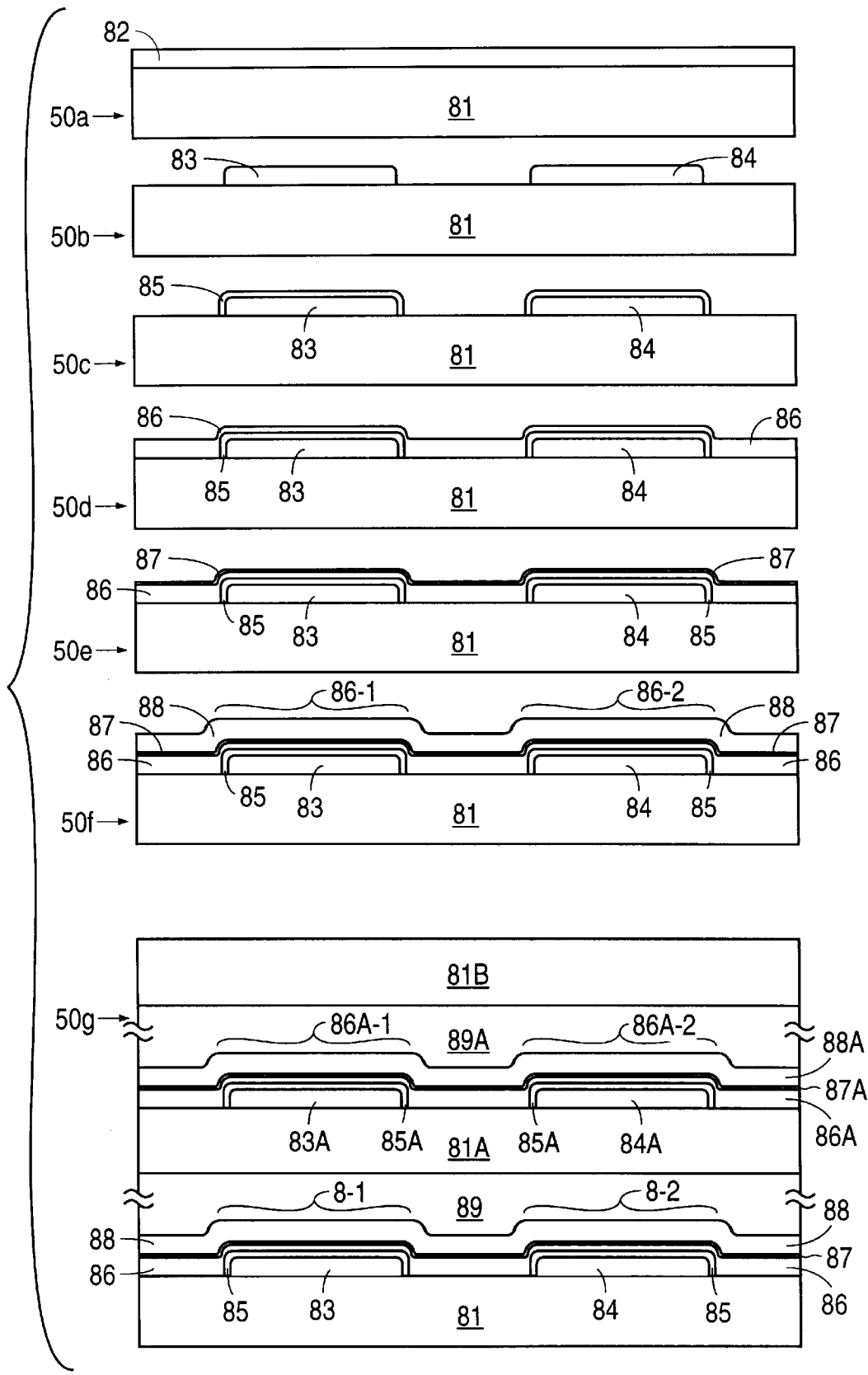
FIG. 7 illustrates various cross-sections of an antifuse structure formed in accordance with the process of FIG. 6.

FIG. 6 is a process flow chart for forming an antifuse in a PCB, PWB, MCM or IC package in accordance with this invention. FIG. 7 illustrates cross-sections 50a–50g of a structure manufactured in accordance with the process of FIG. 6. Initially a PCB core 81 (see PCB cross-section 50a of FIG. 7) is formed by well known PCB process steps. PCB core 81 can be any electrically insulating substrate material (such as for example, epoxy resin, polyimide, alumina, magnesium oxide, zirconium oxide and can include a FIBER GLASS matrix for mechanical strength). Then at step a (FIG. 6), a conductive electrode layer 82 is deposited on PCB core 81 and a mask is used to develop a pattern photo image (not shown) for forming lower electrodes (on the layer shown in FIG. 5C). Then, etch and strip steps are used to form lower electrodes traces 83 and 84. Next, an interfacial conductive layer 85 can be optionally deposited to provide adhesion. Interfacial layer 85 is used to improve adhesion of the antifuse material to the PCB, PWB, MCB or IC package materials and can be formed of, for example, copper and/or nickel. Then a dielectric layer 86 is deposited as shown in cross-section 50d of FIG. 7. Then another interfacial conductive layer 87 is optionally deposited to provide adhesion Interfacial layer 87 is used to improve adhesion of the antifuse material to the PCB, PWB, MCM or IC package materials and can be formed of, for example copper and/or nickel. Then conductive material is deposited and etched to form upper electrode 88. In this manner as shown in cross-section 50f, antifuses 87-1 and 87-2 are formed. After a dielectric layer 89 (See cross-section 50g of FIG. 7) is deposited the above described steps can be repeated as necessary to produce additional layers of antifuses (such as, for example, 87A-1 and 87A-2) and electrodes (such as, for example, 83A and 84A). Next, any necessary via holes can be drilled and plated and any necessary connections can be made for custom circuitry.

The above described method for antifuse fabrication has the advantage of compatibility with the PCB, PWB, MCM or IC package process steps which enables faster speed for product development and better placement and routing architecture for the programmable PCB, PWB, MCM, or IC package.

Although substrate 31 of FIG. 4 and substrate 81 of FIG. 7 have been described above as a PCB core, any appropriate electrically insulating substrate material can be used as substrate 31 or substrate 81 in accordance with this invention. For example, based on the above detailed description, an electrically insulating substrate material can be used to build a programmable PCMCIA logic card or PCMCIA memory card (see PCMCIA I/O Card Interface Specification available from Personal Computer Memory Card International Association of 10308 East Duane Avenue, Sunnyvale, Calif. 94086 which is incorporated herein by reference). Also, an electrically insulating substrate material can be used to build smart cards, credit cards, cards used in automatic teller machines (ATMs), programmable cable connectors and programmable sockets all in accordance with this invention.

While the above description of fuses and antifuses for programmable logic structures is applicable in general to printed circuit boards, multichip modules and integrated circuit packages, this invention can be easily used to form various devices, such as, for example, a programmable cable, a programmable cable connector, a programmable socket and a programmable burn-in board.

Figure 8:
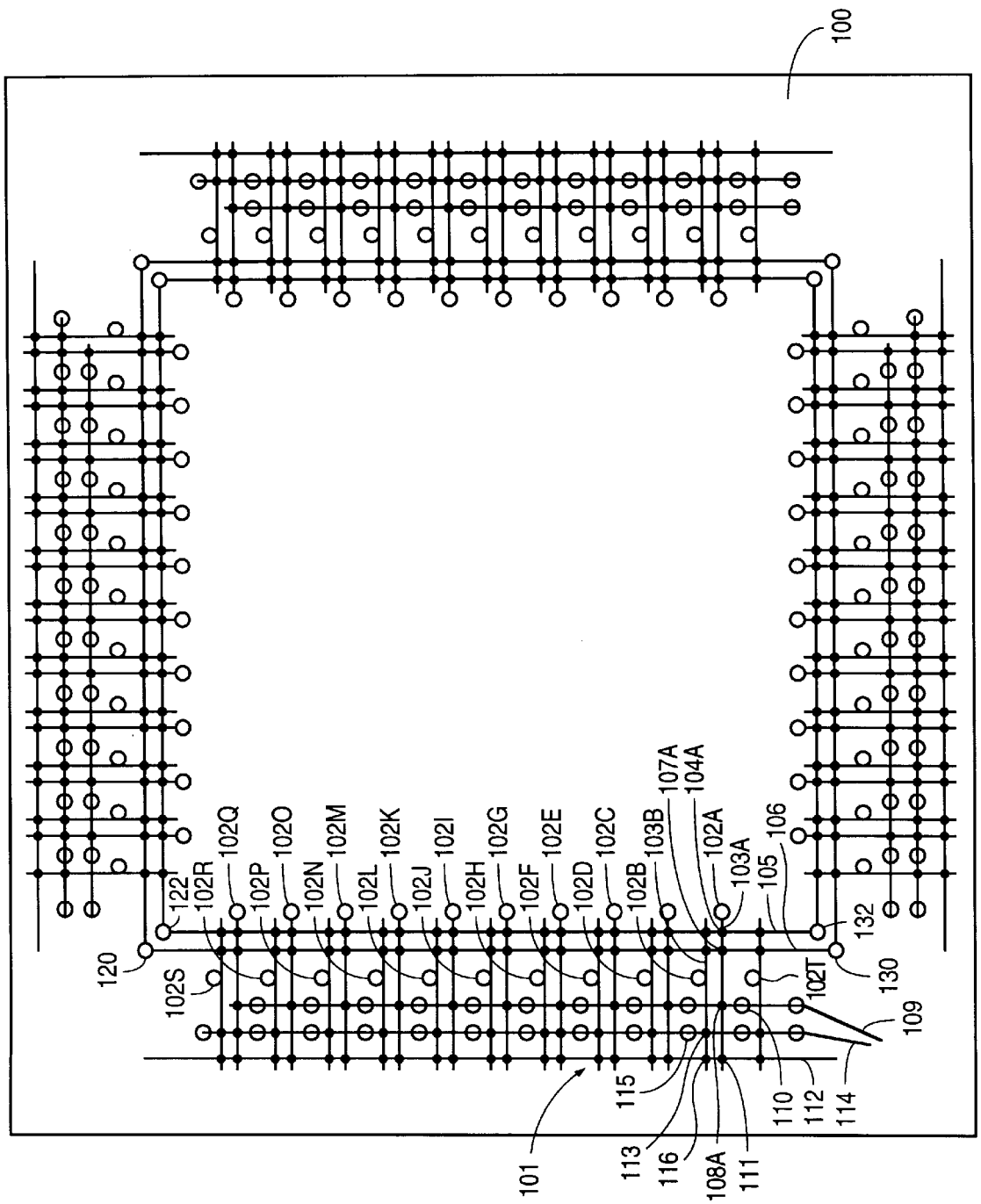
FIG. 8 illustrates an antifuse architecture for a programmable burn-in board in accordance with one embodiment of this invention.

FIG. 8 illustrates an antifuse matrix 101 for a programmable burn-in board 100 in accordance with one embodiment of this invention. As shown in FIG. 8, a burn-in board 100 is provided with socket via holes such as, for example, 102A–102T for receiving the terminals of an electronic component. For the sake of clarity, all the parts of FIG. 8 are not labeled. Each socket via hole in FIG. 8 is connected through antifuses to $V_{cc}$, Ground, Clock signal and resistor packs. For example, as shown in FIG. 8, socket via hole 102A is connected by metal trace 103A through antifuse 104A to metal trace 105. Trace 105 is connected by via holes 122 and 132 to Ground. Also, via hole 102A is connected by trace 103A through antifuse 107A to trace 106. Trace 106 is connected by via holes 120 and 130 to $V_{cc}$. Via hole 102A is connected by trace 103A through antifuse 108A to via hole 110 which is connected by trace 109 in a different layer to a resistor pack. Finally, via hole 102A is connected through antifuse 111 to trace 112 which in turn is connected to the Clock signal. Socket via hole 102B is connected in a manner similar to via hole 102A except that via hole 102B is connected to a different resistor pack by trace 114. In this manner every socket via hole (such as for example 102A–102T) of burn-in board 100 can be connected through antifuses to any one or more of four points: $V_{cc}$, Clock signal, Ground and/or resistor pack.

Although antifuses are shown in FIG. 8, fuses can be used in addition or as alternatives to antifuses to form a programmable burn-in board in accordance with this invention.

For a burn-in board, the operating temperature requirement of about 150° C. is more stringent than typical for a printed circuit board (100–125° C.). Therefore the antifuse or fuse materials must survive at these severe operating temperatures. In accordance with this invention, antifuse dielectric materials for a programmable burn-in board include but are not limited to, high temperature epoxy resins, polyimide and metal oxides. By properly choosing fuse and antifuse materials, a programmable burn-in board can be made at very low additional cost as compared to a typical burn-in board.

Either type of programmable element (i.e. a fuse or an antifuse) can be separately used in a matrix to form programmable board and package substrates. The particular type of programming element is chosen based on a variety of considerations. Fuses as described above have the advantage of very low resistance and almost no capacitance so that the RC delay is negligible. On the other hand, the antifuses described above have higher capacitance and resistance than fuses and have more severe RC delay. For fuses, the fuse thickness need not be controlled very precisely for programming purposes as compared to an antifuse. Finally, fuse manufacturing is easily integrated into the standard PCB, PWB, MCM and IC package manufacturing process. On the other hand antifuses have the advantages of simple architecture and higher density as compared to fuses (because each fuse is associated with a linking via hole). Therefore in using antifuses, less real estate and fewer layers are needed (as compared to fuses) to obtain the same interconnectivity. Antifuses also have the advantage of not requiring high current to be programmed because unprogrammed antifuses do not draw current (whereas, to program a fuse in a matrix a higher current is needed because all the unprogrammed fuses conduct current).

When both types of programmable elements, fuses and antifuses are combined together in a single structure, more efficient placement and routing architecture can be developed to take advantage of the characteristics of both types of programmable elements. For example, in one embodiment of this invention antifuses are added to FIG. 1 at cross-over points (such as, for example, 10AA–10AD) by replacing intermediate layers 38 and 31A (FIG. 4B) with an antifuse dielectric layer (such as, for example, layer 86 of FIG. 7). Combination of both fuses and antifuses together in a single structure allows the architecture to be one time reprogrammable. For example assuming an antifuse is present at cross-over point 10AA (FIG. 1), if there is an error in programming fuse 9AA resulting in an open circuit in a path between via holes 3A and 4A through traces 6A and 5A then antifuse 10AA can be programmed to form a closed circuit in that path. One architecture for using fuses and antifuses in a reprogrammable architecture is described in U.S. Pat. No. 5,200,652 which is incorporated herein in its entirety. Such an architecture can be used for PCBS, PWBS, MCMs and IC packages in accordance with this invention.

The description of certain embodiments of this invention is intended to be illustrative and not limiting. Numerous other embodiments will be apparent to those skilled in the art, all of which are included within the broad scope of this invention. The apparatus and method according to this invention are not confined to PCB, PWB, MCM or IC packages, and can be used in many other applications that require programmable logic substrates other than semiconductor substrates.

TABLE 1

FUSE MATERIALS:

| Element | Melting Point °C. | Boiling Point °C. | Specific Heat cal/g.°C. | Heat of Fusion cal/gm | Coefficient of Thermal Expansion μin/in.°C. | Electrical Resistivity μOhm-om |
|---|---|---|---|---|---|---|
| Tin | 232 | 2270 | 0.05 | 14.50 | 23 | 11.00 |
| Thallium | 303 | 1457 | 0.03 | 5.04 | 28 | 18.00 |
| Lead | 327 | 1725 | 0.03 | 6.26 | 29.3 | 20.65 |
| Zinc | 419.5 | 906 | 0.09 | 24.09 | 39.7 | 5.92 |
| Antimony | 630 | 1380 | 0.05 | 38.30 | 8.5–10.8 | 39.00 |
| Magnesium | 650 | 1107 | 0.25 | 88.00 | 27.1 | 4.45 |
| Aluminum | 660 | 2450 | 0.22 | 94.50 | 23.6 | 2.65 |
| Silver | 960 | 2210 | 0.06 | 25.00 | 19.68 | 1.59 |
| Gold | 1063 | 2970 | 0.03 | 16.10 | 14.2 | 2.35 |
| Copper | 1083 | 2595 | 0.09 | 50.60 | 16.5 | 1.67 |
| Nickel | 1453 | 2730 | 0.11 | 73.80 | 13.3 | 6.84 |
| Chromium | 1875 | 2665 | 0.11 | 96.00 | 6.2 | 12.90 |

RESISTANCE:

| SAMPLE | Width | Thickness | Length | Area |
|---|---|---|---|---|
| Dim(cm) | 7.62E–03 | 3.81E–04 | 1.27E–02 | 3.69E–08 |
| Current (Amp) | 1 | | | |

Resistance = Resistivity × L/(W × T) where L = Length, W = Width and T = Thickness of the fuse
Mass = Density × W × T × L
Temp. Ramp Rate = (Power/Specific Heat) × Mass
1 cal = (1/860) watt × hr.   1 Watt = 860/3600 cal/sec.
Above parameters are referenced from ASM Metals Reference Book published by American Society of Metals, Second Edition (Nov. 1989) (see pages 84 to 89).

TABLE 1-continued

| Element | Electrical Resistivity μOhm-cm | Electrical Resistance Ohm | Power I(2)R cal/sec | Specific Heat cal/g.°C. | Density g/cm³ | Mass g | Temp. Rmp Rate °C./μsec/A | Thermal Conductivity cal/cm/s/°C. |
|---|---|---|---|---|---|---|---|---|
| Antimony | 39.00 | 1.71E−01 | 4.08E−02 | 0.05 | 6.65 | 2.45E−07 | 3.39E+00 | 0.045 |
| Lead | 20.65 | 9.03E−02 | 2.16E−02 | 0.03 | 11.34 | 4.18E−07 | 1.67E+00 | 0.083 |
| Thallium | 18.00 | 7.87E−02 | 1.88E−02 | 0.03 | 11.85 | 4.37E−07 | 1.39E+00 | 0.093 |
| Tin | 11.00 | 4.81E−02 | 1.15E−02 | 0.05 | 7.3 | 2.69E−07 | 7.91E−01 | 1.5 |
| Chromium | 12.90 | 5.64E−02 | 1.35E−02 | 0.11 | 7.19 | 2.65E−07 | 4.62E−01 | 0.16 |
| Magnesium | 4.45 | 1.95E−02 | 4.65E−03 | 0.25 | 1.74 | 6.42E−08 | 2.96E−01 | 0.367 |
| Zinc | 5.92 | 2.59E−02 | 6.18E−03 | 0.09 | 7.13 | 2.63E−07 | 2.57E−01 | 0.27 |
| Nickel | 6.84 | 2.99E−02 | 7.15E−03 | 0.11 | 8.9 | 3.28E−07 | 2.07E−01 | 0.22 |
| Aluminum | 2.65 | 1.16E−02 | 2.77E−03 | 0.22 | 2.7 | 9.96E−08 | 1.30E−01 | 0.53 |
| Gold | 2.35 | 1.03E−02 | 2.46E−03 | 0.03 | 19.3 | 7.12E−07 | 1.11E−01 | 0.71 |
| Silver | 1.59 | 6.96E−03 | 1.66E−03 | 0.06 | 10.49 | 3.87E−07 | 7.69E−02 | 1 |
| Copper | 1.67 | 7.32E−03 | 1.75E−03 | 0.09 | 8.96 | 3.30E−07 | 5.75E−02 | 0.94 |

What is claimed is:

1. A structure comprising:
    a first trace formed as part of a first conductive layer, said first conductive layer including a first electrically conducting material;
    a second trace formed as part of a second conductive layer;
    an insulating plastic material interposed between said first trace and said second trace; and
    an electric fuse formed as a portion of an inner conductive layer of said structure, said electric fuse being electrically coupled between said second trace and said first trace, said electric fuse having a separable portion formed of at least a second electrically conducting material, said second electrically conducting material having a second melting point lower than a first melting point of said first electrically conducting material such that said separable portion disintegrates on passage of a programming current of a predetermined magnitude for a predetermined duration through said electric fuse, the second melting point being lower than 1000° C.;
    wherein said separable portion of said fuse comprises an electrically conductive trace having a hole.

2. The structure of claim 1 wherein said hole has a shape selected from a group consisting of a circle, a square, a triangle and a rectangle.

3. A structure comprising:
    a first trace formed as part of a first conductive layer, said first conductive layer including a first electrically conducting material;
    a second trace formed as part of a second conductive layer;
    an insulating plastic material interposed between said first trace and said second trace;
    an electric fuse formed as a portion of an inner conductive layer of said structure, said electric fuse being electrically coupled between said second trace and said first trace, said electric fuse having a separable portion formed of at least a second electrically conducting material, said second electrically conducting material having a second melting point lower than a first melting point of said first electrically conducting material such that said separable portion disintegrates on passage of a programming current of a predetermined magnitude for a predetermined duration through said electric fuse, the second melting point being lower than 1000° C.; and
    a substrate layer of electrically insulating material formed on said fuse.

4. A multilayered structure comprising:
    a first layer including an insulative plastic material;
    a second layer supported by the first layer, the second layer including at least a trace and an electric fuse connected to the trace,
        wherein the trace is formed of a first electrically conducting material, and the electric fuse includes a separable portion formed of at least a second electrically conducting material different from the first conducting material such that the separable portion disintegrates and forms at least a substantially open circuit on passage of a programming current of a predetermined magnitude for a predetermined duration through the electric fuse, and
        further wherein the electric fuse has a resistance in the range of 1 to 1000 milli-ohm prior to passage of the programming current; and
    means for improving adhesion, said means being interposed between said second electrically conducting material and said first layer;
        wherein said multilayered structure is formed at a temperature lower than approximately 250° C.

5. The structure of claim 4 wherein the separable portion disintegrates to form a completely open circuit on passage of said programming current.

6. The structure of claim 4 wherein first layer comprises epoxy resin.

7. The structure of claim 4 wherein the first layer comprises polyimide.

8. The structure of claim 4 wherein the second electrically conducting material has a melting point lower than 1000° C.

9. The structure of claim 8 wherein the second electrically conducting material includes tin or an alloy of tin.

10. The structure of claim 8 wherein the second electrically conducting material includes lead or an alloy of lead.

11. The structure of claim 8 wherein the second electrically conducting material includes solder.

12. The structure of claim 4 wherein the means for improving adhesion includes copper.

13. The structure of claim 4 wherein the means for improving adhesion includes nickel.

14. A structure comprising:
    a first trace formed as part of a first conductive layer, said first conductive layer including a first electrically conducting material;
    a second trace formed as part of a second conductive layer;
    an insulating plastic material interposed between said first trace and said second trace; and an electric fuse formed as a portion of an inner conductive layer of said structure, said electric fuse being electrically coupled between said second trace and said first trace, said electric fuse having a separable portion formed of at least a second electrically conducting material, said second electrically conducting material having a second melting point lower than a first melting point of said first electrically conducting material such that said separable portion disintegrates on passage of a programming current of a predetermined magnitude for a predetermined duration through said electric fuse, the second melting point being lower than 1000° C.;

wherein:

said inner conductive layer is said first conductive layer;

said second trace is also formed of said first electrically conducting material; and said electric fuse includes means for providing adhesion between the second electrically conducting material and said insulating material.

15. A structure comprising:

a first trace formed as part of a first conductive layer, said first conductive layer including a first electrically conducting material;

a second trace formed as part of a second conductive layer;

an insulating plastic material interposed between said first trace and said second trace;

an electric fuse formed as a portion of an inner conductive layer of said structure, said electric fuse being electrically coupled between said second trace and said first trace, said electric fuse having a separable portion formed of at least a second electrically conducting material, said second electrically conducting material having a second melting point lower than a first melting point of said first electrically conducting material such that said separable portion disintegrates on passage of a programming current of a predetermined magnitude for a predetermined duration through said electric fuse, the second melting point being lower than 1000° C.; and a conductive element formed in said insulating material between said first trace and said second trace, said conductive element being electrically connected by said electric fuse to said first trace; and a conductive connector connecting said conductive element to said second trace, said conductive connector being adjacent to said second trace.

16. The structure of claim 1 wherein said fuse comprises a layer comprising a material selected from a group consisting of copper, lead, tin, lead-tin, solder, aluminum, zinc, thallium, gold and antimony.

17. The structure of claim 1 wherein said fuse comprises a plurality of layers, a first layer of said plurality of layers comprising a first material selected from a group consisting of copper, lead, tin, lead-tin, solder, aluminum, zinc, thallium, gold and antimony, and a second layer of said plurality of layers comprising a second material selected from said group.

18. The structure of claim 1 wherein said first trace has a width in the range of 0.1 micrometer to 10 millimeter.

19. The structure of claim 3 wherein said substrate layer includes a printed circuit board core.

20. The structure of claim 3 wherein said substrate layer includes a burn-in board core.

21. The structure of claim 3 wherein said fuse comprises a layer comprising a material selected from a group consisting of copper, lead, tin, lead-tin, solder, aluminum, zinc, thallium, gold and antimony.

22. The structure of claim 3 wherein said fuse comprises a plurality of layers, a first layer of said plurality of layers comprising a first material selected from a group consisting of copper, lead, tin, lead-tin, solder, aluminum, zinc, thallium, gold and antimony, and a second layer of said plurality of layers comprising a second material selected from said group.

23. The structure of claim 14 wherein said first trace has a width in the range of 0.1 micrometer to 10 millimeters.

24. The structure of claim 14 wherein said insulating plastic material is part of a printed circuit board core.

25. The structure of claim 14 wherein said insulating plastic material is part of a burn-in board core.

26. The structure of claim 14 wherein said fuse comprises a layer comprising a material selected from a group consisting of copper, lead, tin, lead-tin, solder, aluminum, zinc, thallium, gold and antimony.

27. The structure of claim 14 wherein said fuse comprises a plurality of layers, a first layer of said plurality of layers comprising a first material selected from a group consisting of copper, lead, tin, lead-tin, solder, alumninum, zinc, thallium, gold and antimony, and a second layer of said plurality of layers comprising a second material selected from said group.

28. The structure of claim 15 wherein said first trace has a width in the range of 0.1 micrometer to 10 millimeters.

29. The structure of claim 15 wherein said insulating plastic material is part of a printed circuit board core.

30. The structure of claim 15 wherein said insulating plastic material is part of a burn-in board core.

31. The structure of claim 15 wherein said fuse comprises a layer comprising a material selected from a group consisting of copper, lead, tin, lead-tin, solder, aluminum, zinc, thallium, gold and antimony.

32. The structure of claim 15 wherein said fuse comprises a plurality of layers, a first layer of said plurality of layers comprising a first material selected from a group consisting of copper, lead, tin, lead-tin, solder, aluminum, zinc, thallium, gold and antimony, and a second layer of said plurality of layers comprising a second material selected from said group.

* * * * *